(12) United States Patent
Asako

(10) Patent No.: US 11,538,693 B2
(45) Date of Patent: Dec. 27, 2022

(54) SUBSTRATE PROCESSING METHOD AND SUBSTRATE PROCESSING SYSTEM

(71) Applicant: Tokyo Electron Limited, Tokyo (JP)

(72) Inventor: Ryuichi Asako, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/722,147

(22) Filed: Dec. 20, 2019

(65) Prior Publication Data

US 2020/0211857 A1 Jul. 2, 2020

(30) Foreign Application Priority Data

Dec. 28, 2018 (JP) .............................. JP2018-248246

(51) Int. Cl.
| | | |
|---|---|---|
| *H01L 21/311* | (2006.01) | |
| *B05D 1/00* | (2006.01) | |
| *H01L 21/027* | (2006.01) | |

(52) U.S. Cl.
CPC .......... *H01L 21/31144* (2013.01); *B05D 1/60* (2013.01); *H01L 21/0271* (2013.01); *H01L 21/31105* (2013.01)

(58) Field of Classification Search
CPC ........... H01L 21/31144; H01L 21/0271; H01L 21/31105; B05D 1/60
See application file for complete search history.

(56) References Cited

U.S. PATENT DOCUMENTS

| | | | |
|---|---|---|---|
| 2008/0033073 A1* | 2/2008 | Sellergren .............. | B01J 20/268 526/204 |
| 2011/0196111 A1* | 8/2011 | Ma ....................... | C07D 257/04 525/474 |
| 2014/0076815 A1* | 3/2014 | Tan ......................... | C02F 1/288 210/671 |
| 2017/0153547 A1* | 6/2017 | Sim ........................ | C09D 5/006 |
| 2017/0255096 A1* | 9/2017 | Osaki .................. | C09D 133/02 |
| 2019/0098771 A1* | 3/2019 | Fima .................... | C09D 11/107 |
| 2021/0116809 A1* | 4/2021 | Tsuchiya .............. | G03F 7/0382 |

FOREIGN PATENT DOCUMENTS

| | | |
|---|---|---|
| JP | H10-053651 | 2/1998 |
| JP | 2010-533219 | 10/2010 |

OTHER PUBLICATIONS

Wikipedia, "Relative permittivity"; https://en.wikipedia.org/wiki/Relative_permittivity ; pp. 1-7; (Year: 2021).*
Wikipedia, "Aluminum oxide (data page)"; https://en.wikipedia.org/wiki/Aluminium_oxide_(data_page) ; pp. 1-4 (Year: 2019).*
Wikipedia The Free Encyclopeida, "Silicon" via https://web.archive.org/web/20120504100402/https://en.wikipedia.org/wiki/Silicon ; pp. 1-12 (Year: 2012).*
"Facts about Silicon" by Stephanie Pappas; via https://www.livescience.com/28893-silicon.html ; pp. 1-15 (Year: 2018).*

* cited by examiner

*Primary Examiner* — Binh X Tran
(74) *Attorney, Agent, or Firm* — IPUSA, PLLC

(57) ABSTRACT

A substrate processing method is provided. In the method, a substrate is provided. A monomer that is chemically bonded to the substrate is supplied onto the substrate. An initiator for polymerizing the monomer is supplied to the substrate having the supplied monomer thereon, thereby forming a polymer film.

17 Claims, 11 Drawing Sheets

SUBSTRATE PROCESSING METHOD AND SUBSTRATE PROCESSING SYSTEM

CROSS-REFERENCE TO RELATED APPLICATION

The present application is based on and claims priority to Japanese Priority Application No. 2018-248246 filed on Dec. 28, 2018, the entire contents of which are hereby incorporated herein by reference.

BACKGROUND

1. Technical Field

The present disclosure relates to a substrate processing method and a substrate processing system.

2. Description of the Related Art

In the manufacturing processes of semiconductor devices, in order to form devices, interconnections and the like that form the semiconductor devices, film deposition processes are performed in which a polymer film is formed on a substrate such as a semiconductor wafer. The film deposition processes include a method of depositing a polymer film on a surface of a substrate by supplying a monomer on the substrate on which an oxidant that polymerizes the monomer is preliminarily applied or adsorbed, and causing each monomer to be deposited on the substrate by vapor deposition polymerization as described in Japanese Patent Application Publication No. 10-53651 and Japanese Translation of PCT International Application Publication No. 2010-533219.

SUMMARY

The present disclosure is intended to provide a substrate processing method and a substrate processing system that can achieve at least one of selective film deposition on a substrate and inhibition of residual metal after film deposition.

In order to overcome the above problems, one embodiment of the present disclosure provides a substrate processing method. In the method, a substrate is provided. A monomer that is chemically bonded to the substrate is supplied onto the substrate. An initiator for polymerizing the monomer is supplied to the substrate having the supplied monomer thereon, thereby forming a polymer film.

Additional objects and advantages of the embodiments are set forth in part in the description which follows, and in part will become obvious from the description, or may be learned by practice of the disclosure. The objects and advantages of the disclosure will be realized and attained by means of the elements and combinations particularly pointed out in the appended claims. It is to be understood that both the foregoing general description and the following detailed description are exemplary and explanatory and are not restrictive of the disclosure as claimed.

BRIEF DESCRIPTION OF THE DRAWINGS

FIG. 12 is a cross-sectional view of a substrate in which a protective film is further formed in the exposed portion of the substrate in

FIG. 11;

DETAILED DESCRIPTION OF THE PREFERRED EMBODIMENTS

Figure 1:
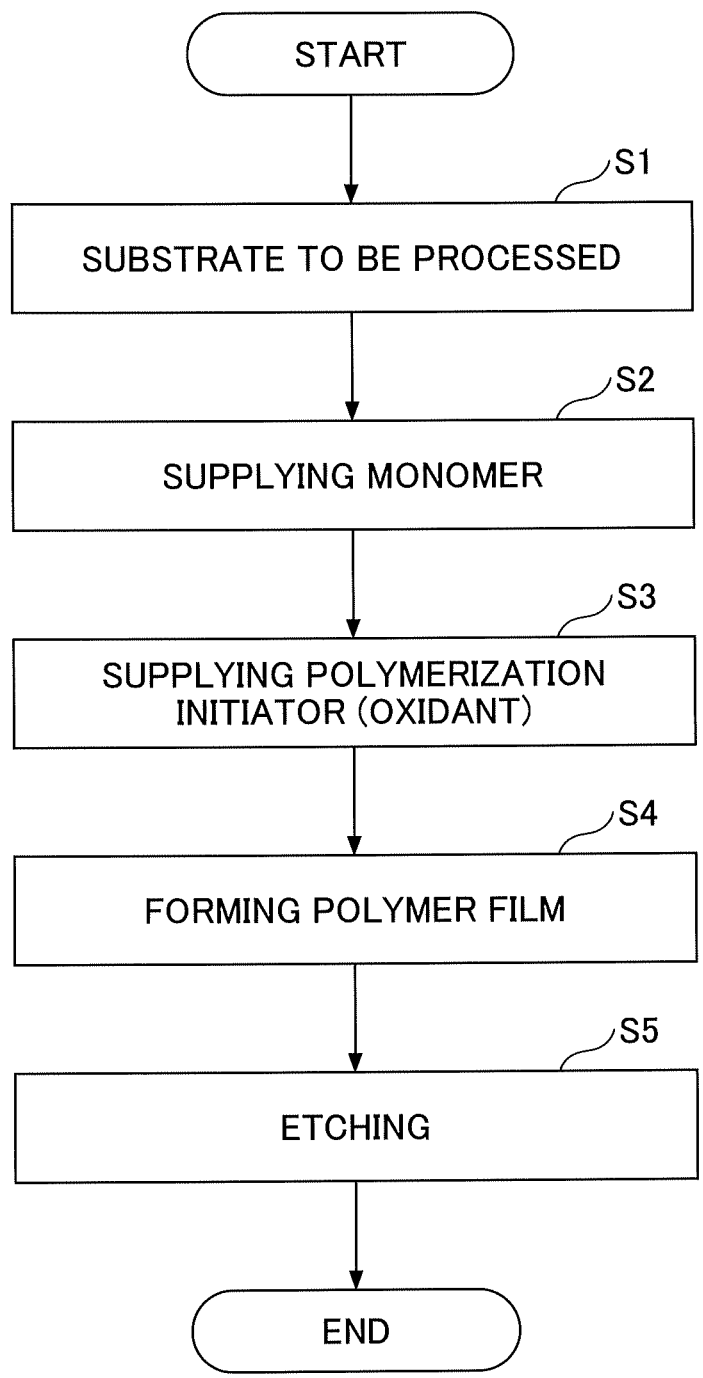
FIG. 1 is a flowchart illustrating a first embodiment of a substrate processing method according to the present disclosure.

Hereinafter, embodiments of the present disclosure will be described in detail with reference to the drawings. In some cases, the same reference numerals are used for parts that are common to the respective drawings, and the description thereof is omitted.

[Substrate Processing Method]

FIG. 1 is a flowchart illustrating a first embodiment of a substrate processing method according to the present disclosure. The substrate processing method according to the first embodiment is a substrate processing method for polymerizing a monomer on a substrate to form a polymer film, and includes a process of supplying a monomer that reacts with and bonds to the substrate onto the substrate, and a process of supplying a polymerization initiator for polymerizing the monomer to the substrate having the supplied monomer thereon. Specifically, as illustrated in FIG. 1, the substrate processing method according to the first embodiment includes a process S1, a process S2, a process S3, a process S4, and a process S5.

In Step S1, a substrate to be processed (which may be simply referred to as a "substrate" hereinafter) is prepared. The substrate to be processed is an example of a substrate processed in the substrate processing method of the present disclosure. The substrate to be processed may be formed of a semiconductor wafer (hereinafter referred to as a wafer) that is subjected to substrate processing to form a device or an interconnection pattern on the substrate. The substrate to be processed is not limited to such a wafer, and may be formed of a glass substrate for manufacturing a flat panel display and the like.

Moreover, the substrate to be processed may have two or more regions, and at least one of the two or more regions may have a higher dielectric constant than that of silicon oxide. Here, the two or more regions are regions arranged in a flat surface as seen from above the substrate. The regions arranged in the flat surface may be arranged on the same plane or may be arranged on different planes with a step in the thickness direction of the substrate.

Having a higher dielectric constant than that of silicon oxide ($SiO_2$) means that the region is made of a material having a higher dielectric constant than that of $SiO_2$ (for example, Si, SiH, SiN, and the like). It should be noted that whereas $SiO_2$ is likely to be bonded to a hydroxyl group (OH group) at a dangling bond (terminal), materials with a higher dielectric constant than that of $SiO_2$, such as Si, SiH, and SiN, are unlikely to be bonded to a hydroxyl group (OH group) at the dangling bond (terminal).

In Step S2, a monomer is supplied to the substrate to be processed. Step S2 is an example of a step of supplying a monomer to a substrate in the substrate processing method according to the present disclosure. Here, the monomer is a small organic compound and is a unit of a polymer that is polymerized to form the polymer.

In the substrate processing method according to the present disclosure, the monomer is chemically bonded to the substrate. Here, a form of a chemical bond is preferably a covalent bond, but not particularly limited. Here, the chemical bond may be a combination of the covalent bond and a chemical bond other than the covalent bond (for example, an ionic bond). Moreover, a part of the monomer may be covalently bonded, and another portion of the monomer may be physically adsorbed (hereinafter referred to as "adsorption") to the substrate by intermolecular force or the like.

Also, the monomer may be chemically bonded to at least one of the two or more regions of the substrate having the dielectric constant higher than that of silicon oxide. Specifically, when the substrate has two regions, if one region is composed of an interface (for example, a $SiO_2$ interface) having a dielectric constant equal to or less than that of silicon oxide, and if the other region is composed of an interface (for example, a Si interface, a SiH interface, a SiN interface and the like) having a dielectric constant higher than that of silicon oxide, the monomer may be chemically bonded to the other region, although the monomer may not be chemically bonded to the one region.

Furthermore, the monomer preferably has an alkenyl group. Here, the alkenyl group is a monovalent group in which one hydrogen atom bonded to any carbon atom of an alkene removed, while being expressed by the general formula $C_nH_{2n-1}-$, where n is an integer of two or greater. The alkenyl group may be substituted with other substituents.

The alkenyl group can be chemically bonded (covalently bonded) to the interface of a material (for example, Si, SiH, SiN, and the like) having a higher dielectric constant than that of silicon oxide. Thus, the monomer can be chemically bonded (covalently bonded) to a substrate (region having a higher dielectric constant than that of silicon oxide) via the alkenyl group.

The alkenyl group included in the monomer is not particularly limited, and for example, a vinyl group, an allyl group and the like are cited as examples. The vinyl group is represented by the general formula $CH_2=CH-$, where a free valence is on the unsaturated carbon atom. The allyl group is also represented by the general formula $CH_2=CHCH_2-$, where the free valence is on the saturated carbon atom. Specific examples of the allyl groups include 2-propenyl, and prop-2-en-1-yl. Among the alkenyl groups contained in the monomer, the vinyl group is preferable.

Also, the monomer preferably has a conjugated heterocyclic compound structure. A conjugated heterocyclic compound forming the conjugated heterocyclic compound structure is, among cyclic compounds containing a bond in which a single bond is interposed between two or more double bonds (conjugated double bonds), a compound containing carbon atoms and the atoms other than carbon (oxygen, nitrogen, sulfur and the like) in the ring. Such conjugated heterocyclic compounds include, for example, compounds represented by the following general formulas (1) and (2).

[Chemical Formula 1]

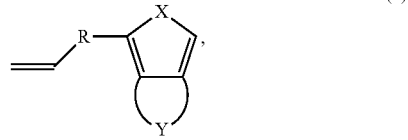

(1)

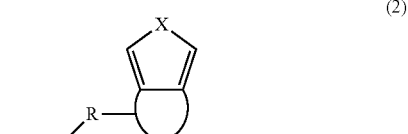

(2)

In the above general formulas (1) and (2), R is an alkyl group having 1 to 20 carbon atoms. X is any one of N (nitrogen), O (oxygen), and S (sulfur). Y is any one of an oxyalkyl group having carbon atoms of 1 to 4 and oxygen atoms of 2 or less, a nitroalkyl group having carbon atoms of 1 to 4 and nitrogen atoms of 4 or less, or a thioalkyl group having carbon atoms of 1 to 4 and sulfur atoms of 2 or less. In addition, if Y is a nitroalkyl group, Y may contain oxygen and/or sulfur; if Y is an oxyalkyl group, Y may contain nitrogen and/or sulfur; and if Y is a thioalkyl group, Y may contain nitrogen and/or oxygen.

The conjugated heterocyclic compound contained in the monomer is not limited to the unsaturated five-membered heterocyclic compound represented by the above-described general formulas (1) and (2), but may be an unsaturated five-membered heterocyclic compound other than the unsaturated five-membered heterocyclic compound represented by the above-described general formulas (1) and (2), an unsaturated six-membered heterocyclic compound, an unsaturated seven-membered heterocyclic compound and the like. Among these, the unsaturated five-membered heterocyclic compound and the unsaturated six-membered heterocyclic compound are preferred; a conjugated heterocyclic compound having an unshared electron pair is more preferred, and at least one selected from an azole (pyrrole), an oxole (furan) and a thiol (thiophene) are further more preferred; and at least one selected from an azole (pyrrole) and a thiol (thiophene) are particularly preferred.

Specific examples of azoles (pyrrole) include 2-vinylpyridine, 2-methyl-6-vinylpyridine, 2,4-divinylpyridine, 2,5-divinylpyridine, 5-ethyl-2-vinylpyridine, 2-(bromomethyl)-6-vinylpyridine, 1,2-dimethyl-5-vinylpyrrol, 1,2-divinyl-1H-pyrrole, and 1-(4-isocyanate phenyl)-1H-pyrrole. It should be noted that any one or two or more of these azoles may be used in combination with each other.

Specific examples of thiols (thiophenes) include 2-vinylthiophene, 2-propadienylthiophene, 2-methyl-5-vinylthiophene, 2-propyl-5-vinylthiophene, 2-butyl-5-vinylthiophene, 2-[(1E,3E)-1,3,8-nonatriene-1-yl]thiophene, 2-ethyl-5-[2-(5-vinyl-2-thienyl)ethyl]thiophene, dithienylethene, 2-methyl-5-[1-(5-vinyl-2-thienyl)-2-propenyl]thiophene, and derivatives of 3,4-ethylenedioxythiophene. It should be noted that any one or more thiols may be used in combination with each other.

A monomer containing a conjugated heterocyclic compound can form a film of a polymer that is highly resistant to oxidation treatment, sputtering, and the like. Also, among conjugated heterocyclic compounds, a conjugated heterocyclic compound with unshared electron pairs, such as a thiol and an azole, has a long conjugated system of double bonds (i.e., composed of long repeats of single and double bonds), so that a monomer containing the thiol or azole can form a film of a polymer that is more resistant to oxidation treatment, sputtering, and the like.

The supply amount of the monomer is not particularly limited, but may be 105% to 150% by weight, 110% to 140% by weight, or 115% to 130% by weight with respect to the mass of the polymer to be processed on the substrate.

In step S3, a polymerization initiator is supplied to the substrate to which the monomer has been supplied in step S2. Step S3 is an example of the step of supplying an initiator onto a substrate in the substrate processing method according to the present disclosure. The polymerization initiator is an example of an initiator that polymerizes a monomer in the substrate processing method of the present disclosure. Here, the polymerization initiator is a compound that generates a radical, a cation, an anion or the like by light, heat or the like, that oxidizes the monomer, and that initiates polymerization of the monomer (a polymerization reaction in which a polymer is synthesized), or a component containing the compound. Hereinafter, the polymerization initiator may be simply referred to as an initiator or an oxidant.

The polymerization initiator is not particularly limited, but for example, a radical initiator may be used. The radical initiator is a compound that produces a radical by light or heat or a component that contains the compound. The polymerization initiator is not particularly limited, but includes, for example, a radical initiator such as an inorganic peroxide, an organic peroxide, an azo compound, and the like.

It is also possible to use a material containing a metal compound such as molybdenum chloride as the polymerization initiator. However, a polymerization initiator that does not contain a metal compound is preferably used when metal incorporation or metal contamination needs to be prevented due to the structure of the semiconductor device.

Examples of inorganic peroxides include ammonium persulfate and hydrogen peroxide.

Specific examples of organic peroxides include t-butyl peroxide, cumene hydroperoxide, p-menthane hydroperoxide, di-t-butyl peroxide, t-butyl kumyl peroxide, acetyl peroxide, isobutyl peroxide, octanoyl peroxide, dibenzoyl peroxide, 3,5,5-trimethylhexanoyl peroxide, and t-butyl peroxide.

Specific examples of azo compounds include azobis isobutyronitrile, azobis-2,4-dimethylvaleronitrile, azobis cyclohexanecarbonitrile, methyl azobisobutyrate. It should be noted that any one or more kinds of the radical initiators may be used in combination with each other.

The supply amount of the polymerization initiator is not particularly limited, but may be 0.01% by weight or more and 2% by weight or less, 0.05% by weight or more and 1.5% by weight or less, and 0.1% by weight or more and 1.0% by weight or less with respect to the supply amount of the monomer supplied to the substrate.

In step S4, the monomer is polymerized on the substrate and a film of a polymer is formed (deposited) on the substrate. The polymer is formed by polymerization of the monomer chemically bonded to the substrate by supplying a polymerization initiator.

The polymerization conditions are not particularly limited, but the polymerization temperature may be 20 degrees C. or more and 180 degrees C. or less, 30 degrees C. or more and 170 degrees C. or less, and 60 degrees C. or more and 160 degrees C. or less. The reaction time of the polymerization may be from 1 minute to 72 hours, from 5 minutes to 20 hours, or from 10 minutes to 10 hours.

Further, the polymer film is formed (deposited) on the substrate. The film thickness of the polymer may be set to any thickness and can be adjusted by changing the supply amount of the monomer, and the polymerization conditions (polymerization temperature and the like). In addition, the film thickness of the polymer can be adjusted by repeating a cycle including Step S2 to Step S4 after completing Step S4. In this case, the supply amount of the monomer and the polymerizing conditions of the monomer can be changed with respect to each cycle.

When the monomer is polymerized on the substrate in Step S4, in addition to the monomer and the polymerization initiator (oxidant), a solvent (organic solvent and the like), a radical scavenger (polymerization stopper or quencher), a molecular weight adjusting agent, a crosslinking agent, a surfactant, a stabilizer, a dye and the like may be supplied as another additive.

In Step S5, the substrate on which the polymer film is formed is etched. Step S5 is an example of etching a substrate in the substrate processing method according to the present disclosure. Also, the etching is an example of etching a substrate on which a polymer film is formed in the substrate processing method according to the present disclosure.

Forms of etching are not particularly limited, but can be, for example, dry etching, wet etching, or the like. In addition, the intended use of the polymer film is not particularly limited, but, for example, may be used as a protective film (resist mask) in the etching process.

Figure 2:
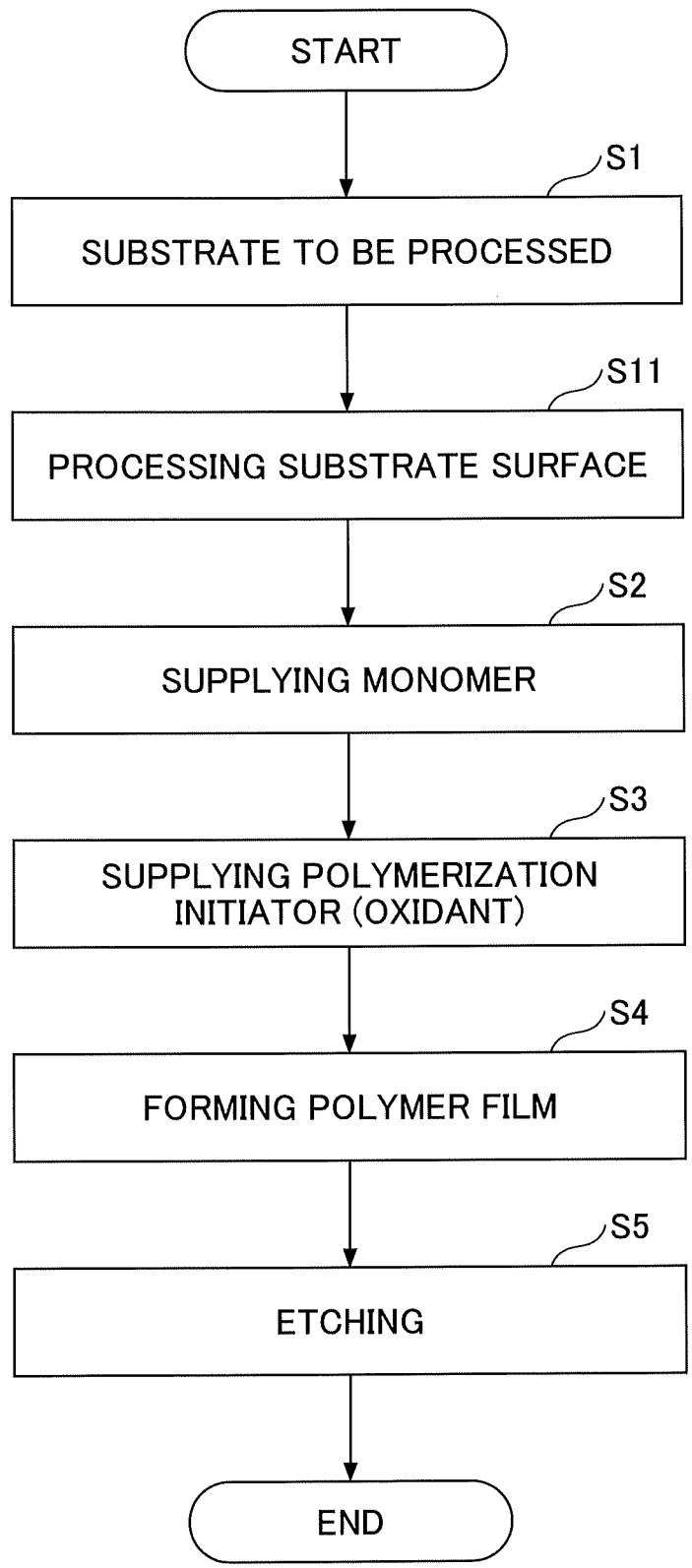
FIG. 2 is a flowchart illustrating a second embodiment of a substrate processing method according to the present disclosure.

FIG. 2 is a flowchart illustrating a second embodiment of a substrate processing method according to the present disclosure. In FIG. 2, the same reference numerals are used for the portions common to FIG. 1, and the description thereof is omitted.

In the substrate processing method of the second embodiment, Step S11 is included before Step S2 of supplying the monomer. In Step S11, the surface of the substrate is processed. Specifically, at least one region having a dielectric constant higher than that of silicon oxide of two or more regions of the substrate is terminated with hydrogen. Step S11 is an example of a hydrogen terminating step in the substrate processing method according to the present disclosure.

As used herein, a hydrogen termination means that a hydrogen atom is bonded to a dangling bond on the surface of the substrate (region) (for example, a Si interface, a SiH interface, a SiN interface, and the like), thereby activating the surface of the substrate (region) with respect to an alkenyl group.

The surface of the substrate (region) terminated with hydrogen becomes a Si—H group at the Si interface, for example. When a monomer (for example, a monomer having a vinyl group) that is chemically bonded to the substrate surface is supplied, a Si—C bond (covalent bond) can be formed between the Si—H group on the substrate surface and the vinyl group of the monomer (see Reaction formula (3) below). This allows the monomer to be bonded (chemically bond) to the substrate surface.

[Chemical Formula 2]

(3)

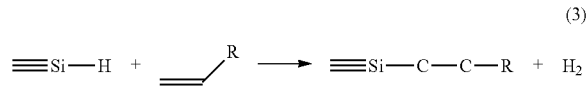

In the reaction formula (3), R indicates an alkyl group having 1 to 20 carbon atoms.

Figure 3:
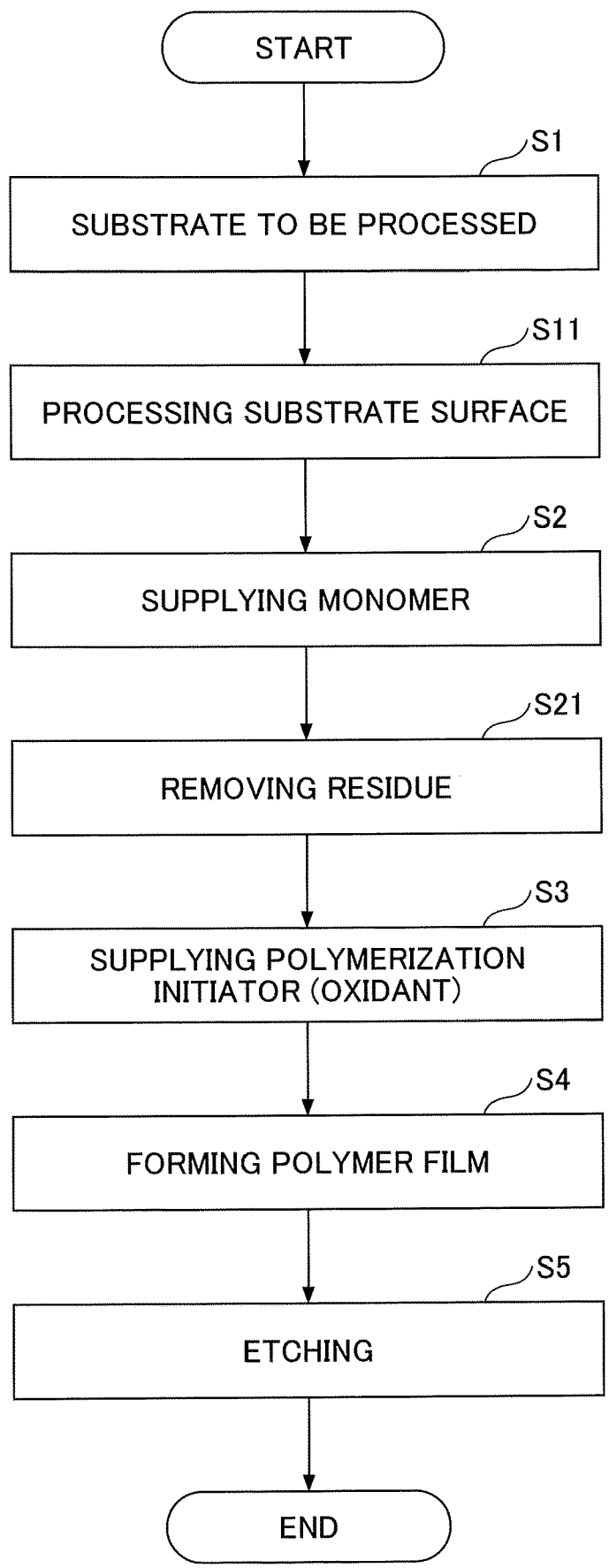
FIG. 3 is a flowchart illustrating a third embodiment of a substrate processing method according to the present disclosure.

FIG. 3 is a flowchart illustrating a third embodiment of a substrate processing method according to the present disclosure. In FIG. 3, the same reference numerals are used for the portions common to FIG. 1, and the description thereof is omitted.

In the substrate processing method of the third embodiment, Step S21 is included after Step S2 of supplying the monomer. In Step S21, a residue on the substrate is removed. Such a residue may be, for example, impurities such as dust or dirt, or a monomer supplied on the substrate that is not chemically bonded to the substrate or the like.

In Step S21, the method for removing the residue is not particularly limited. However, for example, a process of heating the substrate (a baking process), a process of setting the substrate in a high vacuum atmosphere (a high vacuum process), a process of purging the substrate with an inert gas (a purge process), a process of irradiating the substrate with ultraviolet rays or the like (a light irradiation process), and a process of cleaning the substrate (a cleaning process) can be used. In Step S21 of the third embodiment, among these, the baking process is performed. In the meantime, this baking process is an example of the process of removing the residue in the present disclosure.

In the third embodiment, the residue on the substrate is removed by such a residue removal method. Specifically, an unwanted material such as a monomer (a monomer not chemically bonded to a substrate) supplied to a region of a substrate composed of impurities such as dust, dirt, or a material having a dielectric constant equal to or lower than that of silicon oxide can be removed. Such a residue removal does not remove the monomer that is chemically bonded to the substrate (monomer that contributes to polymer formation), but removes the monomer that is not chemically bonded to the substrate (monomer that does not contribute to the polymer formation).

When the process of removing the residue in Step S21 is a baking process, the heating condition of the baking process is not particularly limited. As heating conditions for the baking process, for example, the heating temperature may be 30 degrees C. or more and 200 degrees C. or less, 50 degrees C. or more and 180 degrees C. or less, or 60 degrees C. or more and 170 degrees C. or less. The baking period of time may be 5 seconds or more and 3 minutes or less, and may be 10 seconds or more and 60 seconds or less. Such a baking process is preferably carried out in a humidity controlled environment.

Figure 4A:
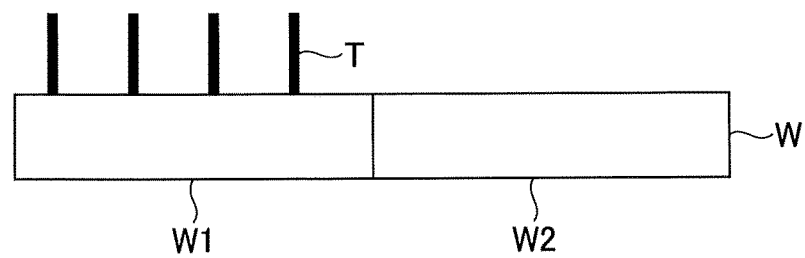
FIGS. 4A to 4E are schematic diagrams of depositing a polymer on a substrate having two regions using a substrate processing method according to the present disclosure.

FIGS. 4A to 4E are schematic diagrams of a case in which a polymer is deposited on a substrate having two regions according to a substrate processing method of the present disclosure. The substrate processing method according to the present disclosure will now be described with reference to FIGS. 4A to 4E. In FIG. 4A, a wafer W having two regions W1 and W2 is prepared as a substrate to be processed (substrate) (see Step S1 of FIGS. 2 and 3). The region W1 may be a film containing silicon or a metal. The region W2 may be a film that differs in composition from the composition of the region W1 containing silicon or the metal.

In the wafer W, for example, the region W1 is formed of silicon nitride ($Si_3N_4$) and the region W2 is formed of silicon oxide ($SiO_2$). That is, the dielectric constant of the region W1 (silicon nitride) is higher than that of the region W2 (silicon oxide). The region W1 of the wafer W is then terminated with hydrogen. Specifically, as illustrated in FIG. 4A, the surface of the region W1 is composed of a Si—H group (termination group T) (see Step S11 of FIG. 3). Instead of the above, the region W1 may be formed of silicon (Si) and the like, and the region W2 may be formed of aluminum oxide ($Al_2O_3$), titanium oxide ($TiO_2$) and the like.

Figure 4B:
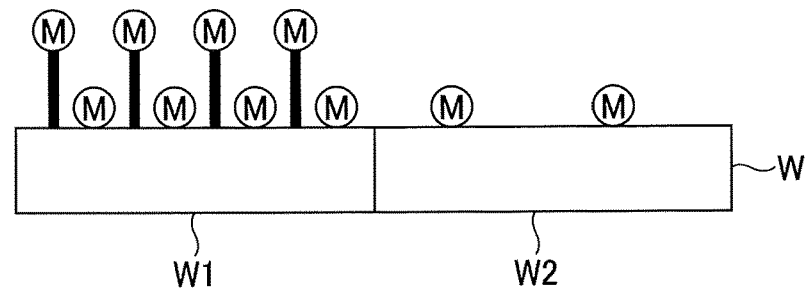

In FIG. 4B, a conjugated heterocyclic compound (thiophene) having a vinyl group, which is one of the alkenyl groups, is supplied to the wafer W as a monomer M. A part of the monomer M supplied to the wafer W is chemically bonded to the region W1 by a covalent bond of the vinyl group of the monomer M to the termination group T on the region W1. Another part of the monomer M is chemically bonded to the region W1 by a covalent bond in which the vinyl group of the monomer M is bonded to the region W1 without the termination group T. The remainder of the monomer M is also adsorbed on the region W2 (see Step S2 of FIG. 3).

Figure 4C:
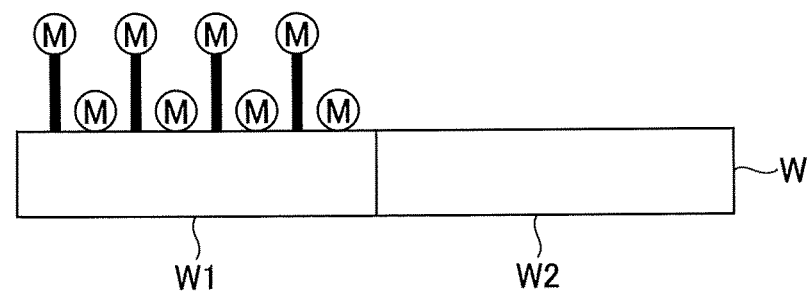

In FIG. 4C, for example, the wafer W on which the monomer M is supplied is baked. This baking process removes the monomer M (the monomer that cannot be chemically bonded to the substrate) adsorbed on the region W2 of the wafer W (see Step S21 of FIG. 3).

Figure 4D:
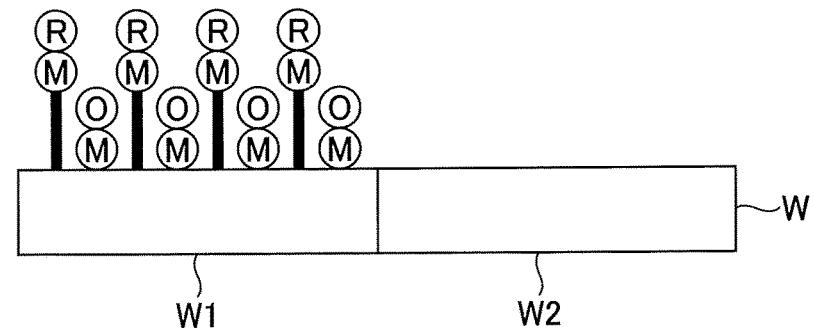
Figure 4E:
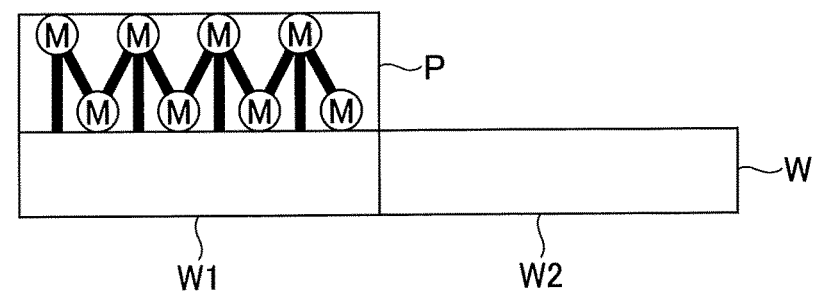
Figure 5A:
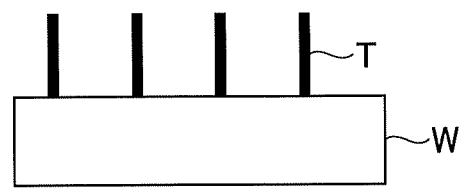
FIGS. 5A to 5E are schematic diagrams of depositing a polymer on a substrate having one region using a substrate processing method according to the present disclosure.
Figure 5B:
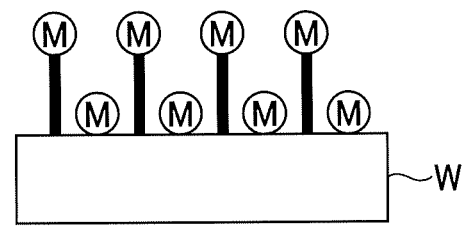
Figure 5C:
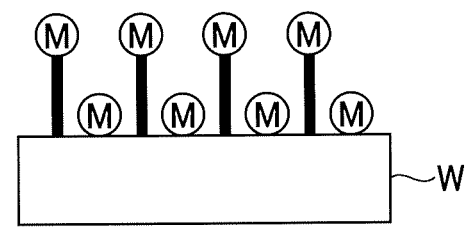
Figure 5D:
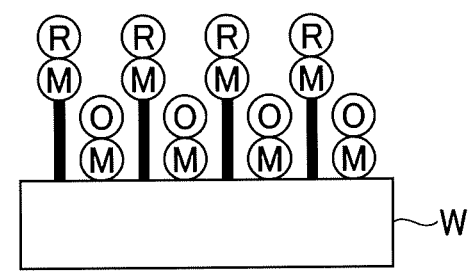
Figure 5E:
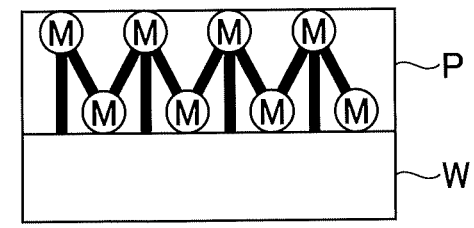

In FIG. 4D, a radical initiator as a polymerization initiator R is supplied to the wafer W. The polymerization initiator R is supplied to the wafer W having the monomer M chemically bonded to the region W1 (see Step S3 of FIG. 3). In FIG. 4E, the monomer M is polymerized on the wafer W, and a film of a polymer P is formed (deposited) on the wafer W (see Step S4 of FIG. 3).

In FIG. 4E, the polymerization reaction in which the monomer M is polymerized on the wafer W and the polymer P is synthesized, is illustrated in Reaction Formulas (4) and (5) below. In Reaction Formula (4), dimers are formed by polymerization of two monomer units M in the presence of the polymerization initiator R (hydrogen peroxide). Subsequently, in Reaction Formula (5), dimers formed in Reaction Formula (4) are sequentially polymerized with (n−2) monomer units M (n is an integer of 3 or more; the same applies below) to form a polymer P in which n monomer units M are polymerized.

[Chemical Formula 3]

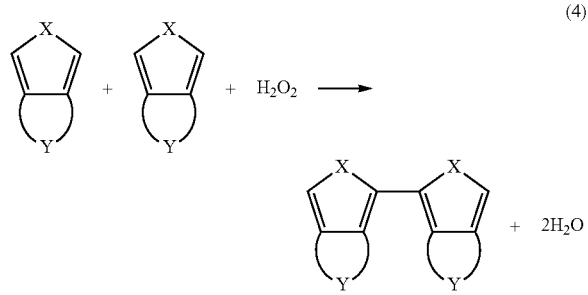

(4)

[Chemical Formula 4]

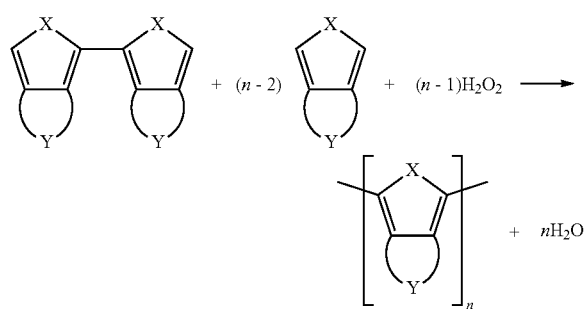

(5)

In a conventional film deposition process, an oxidizing agent is supplied to a substrate surface before a monomer is supplied. Therefore, even when regions having different properties are present on the substrate surface, the substrate surface is uniformly oxidized by the oxidizing agent. Therefore, even if a monomer that can be selectively adsorbed depending on different inherent properties of substrate regions is supplied, the monomer is uniformly adsorbed, and it is difficult to selectively form a polymer with respect to the substrate.

In contrast, the substrate processing method according to the present disclosure includes the step of supplying a monomer M (monomer) that is chemically bonded to a wafer W (a substrate) onto a substrate as illustrated in FIG. 4B. Also, as illustrated in FIG. 4D, the substrate processing method according to the present disclosure includes the step of supplying a polymerization initiator R (an initiator) to polymerize the monomer on the substrate on which the monomer is supplied. Then, as illustrated in FIG. 4E, a film of a polymer P (polymer) is formed by polymerizing the monomer on the substrate.

Thus, in the substrate processing method according to the present disclosure, the polymerization initiator R (initiator) is supplied after a monomer M (monomer) is supplied (see Step S2 and Step S3 of FIG. 3). Thus, if regions of different properties are present on the substrate surface and only a part of the different property regions is a region that is chemically bonded to the monomer, the monomer is selectively and chemically bonded to the part of the different property regions.

When the initiator is supplied to the substrate in this state, a film of the polymer is formed on the part of the region to which the monomer is chemically bonded, and is not formed on the other regions to which the monomer is not chemically bonded (see step S4 of FIG. 3). Therefore, according to the substrate processing method of the present disclosure, the polymer can be selectively processed depending on the substrate regions having different properties. Hence, according to the substrate processing method of the present disclosure, by supplying the monomer depending on the substrate material, the polymer can be selectively deposited on the substrate.

Specifically, in the substrate processing method according to the present disclosure, by supplying the monomer M that is chemically bonded to the region W1 of the wafer W onto the wafer W as illustrated in FIGS. 4B and 4C, the monomer M is bonded to the surface of the region W1 with respect to the wafer W but is not bonded to the surface of the region W2 (see Step S2 of FIG. 3). That is, in the present embodiment, the monomer M can be selectively and chemically bonded to the region W1 of the wafer W.

Then, as illustrated in FIG. 4D, when the polymerization initiator R is supplied to the wafer W, the monomer M is polymerized on the region W1 of the wafer W as illustrated in FIG. 4E (see Step S3 of FIG. 3). Thus, a polymer film is formed on the region W1 of the wafer W but is not formed on the region W2 of the wafer W (see Step S4 of FIG. 3). That is, according to the substrate processing method of the present disclosure, the polymer can be selectively deposited on the region W1 of the wafer W.

FIGS. 5A to 5E are schematic diagrams of a case where a polymer is deposited on a substrate having one region in accordance with a substrate processing method according to the present disclosure. In FIGS. 5A to 5E, the same reference numerals are used for the portion common to FIGS. 4A to 4E and the description thereof is omitted. In FIGS. 5A to 5E, the polymerization initiator R is supplied to one region of the wafer W in a state where a monomer M is chemically bonded to the region, and a polymer P is formed (deposited).

In conventional film formation processes, it is difficult to uniformly adsorb the polymerization initiator on the substrate by simply bringing (or evaporating) the polymerization initiator into contact with the substrate, because the polymerization initiator (oxidant) is supplied prior to supplying the monomer. In addition, in a conventional film formation process in which a metal compound is used as a polymerization initiator (oxidant), the metal is likely to remain as a foreign material in the polymer after film deposition.

In contrast, in the substrate processing method according to the present disclosure, as illustrated in FIGS. 5A to 5E, the polymerization initiator R (initiator or oxidant) is supplied after the monomer M (monomer) is supplied. Therefore, in the substrate processing method according to the present disclosure, the polymerization of the monomer M can be initiated simply by bringing the polymerization initiator R (initiator or oxidant) into contact with a region (wafer W) of the substrate surface to which the monomer M is chemically bonded as a gas (or in a gas phase).

In addition, as described above, the polymerization initiator R (initiator or oxidant) can be initiated by simply bringing the monomer M into contact with the substrate as a gas (or in a vapor phase), so that the polymerization initiator R (initiator or oxidant) has a low boiling point. Therefore, in the substrate processing method according to the present disclosure, it is not necessary to use a metal compound as a polymerization initiator. Accordingly, according to the substrate processing method of the present disclosure, it is possible to inhibit the residue of the metal as a foreign material in the polymer after the film deposition (see FIGS. 5A to 5E).

In the substrate processing method according to the present disclosure, the surface of the region W1 of the wafer W (Si interface) is terminated with hydrogen and a Si—H group is formed (see Step S11 in FIG. 3). When a monomer M having a vinyl group is supplied to the surface of the region W1 terminated with hydrogen, a Si—C bond (a covalent bond) can be formed between the Si—H group on the surface of the region W1 of the wafer W and the vinyl group of the monomer. Thus, the monomer M is easily covalently bonded with the region W1 of the wafer W, and thus can be efficiently chemically bonded to the wafer W (the substrate). Therefore, the selective polymer deposition on the region W1 of the wafer W can be efficiently achieved.

Also, the monomer M includes an alkenyl group (vinyl group), which can be covalently bonded to the region W1 of the wafer W (such as a Si interface having a dielectric constant higher than that of silicon oxide). Thus, the monomer M can be efficiently chemically bonded to the region W1 of the wafer W via the vinyl group. Thus, the polymer film can be selectively formed (deposited) on the region W1 of the wafer W where the monomer M is chemically bonded.

In the substrate processing method of the present disclosure, impurities on the substrate can be removed by baking the substrate after the monomer M is supplied. In particular, in this embodiment, the monomer M adsorbed on the surface of the region W2 of the wafer W (SiO2 interface) can be removed. Therefore, the monomer M, which is not chemically bondable to the wafer W (i.e., does not contribute to polymer formation), can be prevented from remaining on the substrate after the polymer P is deposited.

Further, in the substrate processing method of the present disclosure, the monomer M includes the structure of a conjugated heterocycle compound (for example, thiophene), and the polymer P of the film formed by polymerizing the monomer M has a longer conjugate system of double bonds, and is likely to be highly resistant to an oxidation treatment, sputtering, and the like.

The radical initiator can also increase the polymerization efficiency of the monomer M having a conjugated heterocyclic structure. In the substrate processing method of the present disclosure, because such a radical initiator is used as the polymerization initiator R, it is possible to increase the film deposition efficiency of the polymer P. Among the radical initiators, an inorganic peroxide (excluding those containing metals), an organic peroxide, an azo compound and the like have low boiling points and are free of a metal. Therefore, by using these radical initiators as the polymerization initiator, it is possible to effectively reduce the problem of the metal residue after the film deposition.

[Substrate Processing System]

Figure 6:
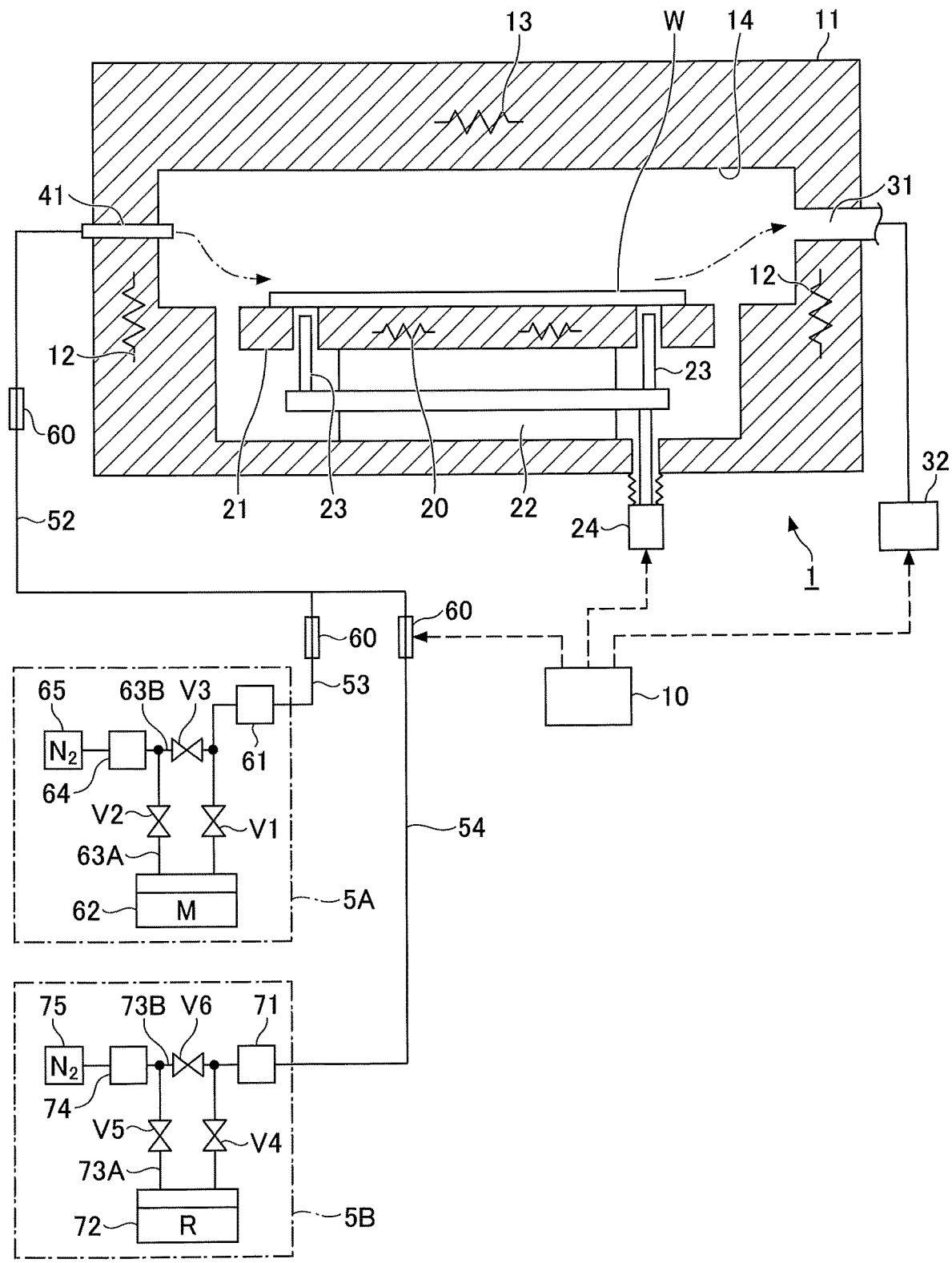
FIG. 6 is a cross-sectional view of a substrate processing apparatus illustrating an embodiment of a substrate processing system according to the present disclosure.

FIG. 6 is a cross-sectional view of a substrate processing apparatus 1 illustrating an embodiment of a substrate processing system according to the present disclosure. In the substrate processing apparatus 1 according to the present embodiment, the substrate processing method described above is performed. Specifically, the substrate processing apparatus 1 according to the present embodiment includes a processing chamber 11 in which a vacuum atmosphere is formed, a loading section (stage 21) on which a substrate (wafer W) is loaded in the processing chamber 11, a first supply (first component supply mechanism 5A) for supplying a monomer (first component) to the processing chamber 11, a second supply (second component supply mechanism 5B) for supplying the above-described initiator (second component) into the processing chamber 11, and a controller (computer 10) for causing the initiator to be supplied into the processing chamber 11 by the second supply after the monomer is supplied into the processing chamber 11 by the first supply. The substrate processing apparatus 1 is an example of an apparatus for implementing a substrate processing system according to the present disclosure.

The processing chamber 11 is formed as a circular and hermetically sealed vacuum chamber to form a vacuum atmosphere therein. The side wall of the processing chamber 11 includes a side wall heater 12. A ceiling heater 13 is provided in the ceiling wall of the processing chamber 11. The ceiling surface 14 of the ceiling wall (ceiling) of the processing chamber 11 is formed as a horizontal flat surface whose temperature is controlled by the ceiling heater 13. In addition, when a component capable of forming the film at a relatively low temperature is used, heating by the side wall heater 12 and/or the ceiling heater 13 is not required. It should be noted that the shape of the vacuum chamber forming the processing chamber 11 in a plan view is not limited to a circular shape, but may be another shape, such as a rectangle.

A stage 21 is disposed on the lower side of the processing chamber 11. A loading section on which a substrate (wafer W) is loaded is formed on the stage 21. The stage 21 is circularly formed and a wafer W is placed on a horizontally formed surface (top surface). It should be noted that the stage 21 is not limited to a circular shape but may be another shape, such as a square shape. The substrate is not limited to the wafer W, and a glass substrate for manufacturing a flat panel display and the like may be processed.

The wafer W has two regions W1 and W2 as described above. Specifically, the wafer W has a region W1 formed of silicon (Si) and a region W2 formed of silicon oxide (SiO2). That is, the dielectric constant of region W1 (silicon) is higher than that of region W2 (silicon oxide). The region W1 of the wafer W is terminated with hydrogen, and the region W1 of the wafer W is composed of a Si—H group (termination group T) (see FIG. 4A).

A stage heater 20 is embedded in the stage 21. The stage heater 20 may heat a wafer W placed on the stage 21. In addition, when a component capable of forming the film at a relatively low temperature is used, heating by the stage heater 20 is not required.

The stage 21 is supported in the processing chamber 11 by a columnar support 22 disposed on the bottom surface of the processing chamber 11. Lift pins 23 vertically moving up and down are disposed outside the columnar support 22 in the circumferential direction. The lift pins 23 are each inserted into through-holes that are provided circumferentially spaced apart from the stage 21. In FIG. 6, two of the three lift pins 23 are illustrated. The lift pins 23 are controlled and moved up and down by a lifting mechanism 24. When the lift pins 23 protrude from the surface of the stage 21, a wafer W is transferred between a transfer mechanism (not illustrated) and the stage 21.

The side wall of the processing chamber 11 includes an exhaust port 31 that is open. The exhaust port 31 is connected to the exhaust mechanism 32. The exhaust mechanism 32 comprises a vacuum pump, a valve, and the like through an exhaust pipe to adjust an exhaust flow rate from the exhaust port 31. By adjusting the exhaust flow rate and the like by the exhaust mechanism 32, the pressure in the processing chamber 11 is adjusted. The side wall of the processing chamber 11 includes a transfer port (not illustrated) of the wafer W at a position different from the position where the exhaust port 31 opens.

A gas nozzle 41 is disposed in the side wall of the processing chamber 11 at a position different from the exhaust port 31 and the transfer port (not illustrated). The gas nozzle 41 supplies the monomer and the polymerization initiator described above into the processing chamber 11.

Specifically, the monomer is included in a first component (hereinafter, referred to as a "component E1"), the polymerization initiator is included in a second component (hereinafter, referred to as a "component E2"), and the respective components (component E1 and component E2) are supplied into the processing chamber 11.

The monomer contained in the component E1 is the monomer that is polymerized to form the polymer described above. In this embodiment, a thiophene derivative having an alkenyl group (vinyl group) (hereinafter, referred to as a thiophene derivative) is used as the monomer included in the component E1. Specifically, a thiophene derivative in which a vinyl group is substituted with 3,4-ethylenedioxythiophene (hereinafter referred to as an "EDOT derivative") is used. Incidentally, the monomer included in the component E1 is not limited to the thiophene derivative, but may be the first component forming the monomer described above.

The polymerization initiator contained in the component E2 is an initiator (oxidant) that polymerizes the monomer contained in the component E1. In the present embodiment, hydrogen peroxide (HP), which is one of the radical initiators, is used as the component E2. Incidentally, the component E2 is not limited to hydrogen peroxide (HP), but may be a component that can be a second component forming the above-described polymerization initiator.

The gas nozzle 41 forms a cutout (component gas supply) for supplying the respective components (component E1 and component E2) for forming the above-described polymer film (for example, a protective film). The gas nozzle 41 is disposed in the side wall of the processing chamber 11 opposite to the exhaust port 31 as seen from the center of the stage 21.

The gas nozzle 41 is formed as a rod projecting from the side wall of the processing chamber 11 toward the center of the processing chamber 11. The tip of the gas nozzle 41 extends horizontally from the side wall of the processing chamber 11. Each of the components (component E1 and component E2) is discharged from the discharge hole opening at the tip of the gas nozzle 41 into the processing chamber 11, flows in the direction of an arrow of a dashed line illustrated in FIG. 6, and is evacuated from the exhaust port 31.

It should be noted that the tip of the gas nozzle 41 is not limited to this shape. The tip of the gas nozzle 41 may be obliquely downwardly extending toward the placed wafer W or obliquely upwardly extending toward the ceiling surface 14 of the processing chamber 11 in order to enhance the efficiency of the film deposition.

When the tip of the gas nozzle 41 is shaped so as to extend obliquely upwardly toward the ceiling surface 14 of the processing chamber 11, the discharged components (components E1, E2) hit the ceiling surface 14 of the processing chamber 11 before being supplied to the wafer W. The area where the gas collides with the ceiling surface 14 is positioned, for example, closer to the discharge hole of the gas nozzle 41 than the center of the stage 21, and is positioned near the edge of the wafer W as seen in a plan view.

In this way, when each of the components (component E1, component E2) collides with the ceiling surface 14 and then is supplied to the wafer W, the distance in which each of the components (component E1, component E2) discharged from the gas nozzle 41 moves to the wafer W is longer than the distance in which each of the components is directly supplied from the gas nozzle 41 to the wafer W. As the travel distance of each of the components increases in the processing chamber 11, each of the components diffuses laterally and is supplied with high uniformity onto the surface of the wafer W.

As described above, the gas nozzle 41 is not limited to such a configuration that the gas nozzle 41 is disposed on the side wall of the processing chamber 11, but may be disposed in the ceiling wall of the processing chamber 11. Further, the exhaust port 31 for the gas nozzle 41 is not limited to such a configuration that the exhaust port 31 is disposed in the side wall of the processing chamber 11 as described above, but may be disposed in the bottom surface of the processing chamber 11. In the meantime, the exhaust port 31 and the gas nozzle 41 are preferably formed in the side wall of the processing chamber 11 as described above in order to form an air stream of the component so as to flow from one end to the other end of the surface of the wafer W and to form a film with high uniformity on the wafer W.

The temperature of each of the components (component E1, component E2) discharged from the gas nozzle 41 may be set at any temperature, but from the viewpoint of preventing liquefaction in the flow passage until supplied to the gas nozzle 41, the temperature before supplied to the gas nozzle 41 is preferably higher than the temperature in the processing chamber 11. In this case, the components discharged into the processing chamber 11 are cooled down and supplied to the wafer W. By lowering the temperature in such a way, the adsorptive properties of the respective components to the wafer W improve, and the film deposition proceeds efficiently. The temperature in the processing chamber 11 is preferably higher than the temperature of the wafer W (or the temperature of the stage 21 where the stage heater 20 is embedded) in order to further enhance the adsorptive properties of the wafer W.

The substrate processing apparatus 1 includes a gas supply pipe 52 that is connected to the gas nozzle 41 from the outside of the processing chamber 11. The gas supply pipe 52 includes gas introduction pipes 53 and 54 that branch upstream. The upstream side of the gas introduction pipe 53 is connected to a vaporizing section 62 through a flow adjustment section 61 and a valve V1 in this order.

In the vaporizing section 62, a component E1 containing the monomer M (EDOT derivative) described above is stored in a liquid state. The vaporizing section 62 includes a heater (not shown) for heating the component E1. The vaporizing section 62 is connected to one end of the gas supply pipe 63A, and the other end of the gas supply pipe 63A is connected to a $N_2$ (nitrogen) gas supply source 65 through a valve V2 and a gas heating section 64 in this order. In this configuration, the heated $N_2$ gas is supplied to the vaporizing section 62 to vaporize the component E1 in the vaporizing section 62, and a mixed gas 1 of $N_2$ gas used for the vaporization and the component E1 gas can be introduced to the gas nozzle 41 as the first component (the component E1).

A gas supply pipe 63B is also formed on the downstream side of the gas heater section 64 in the gas supply pipe 63A. The gas supply pipe 63B diverges upstream from the valve V2, and the downstream end of the gas supply pipe 63B is connected via a valve V3 to the downstream side of the valve V1 of the gas introduction pipe 53 and the upstream side of the flow adjustment section 61. With such a configuration, when the above-described component E1 (the first component) is not supplied to the gas nozzle 41, $N_2$ gas heated by the gas heater 64 is introduced to the gas nozzle 41 without passing the vaporizing section 62.

In FIG. 6, the first component supply mechanism 5A includes the flow rate adjustment section 61, the vaporizing section 62, the gas heating section 64, the $N_2$ gas supply source 65, the valves V1 to V3, the gas supply pipes 63A and 63B, and the downstream portion of the flow rate adjustment section 61 in the gas introduction tube 53. The first component supply mechanism 5A and the gas nozzle 41 are examples of the first supply that constitutes a part of the substrate processing system of the present disclosure.

The upstream side of the gas introduction pipe 54 is connected to the vaporizing section 72 through the flow rate adjustment section 71 and the valve V4 in this order. The polymerization initiator R (HP) described above is stored in a liquid state in the vaporizing section 72. The vaporizing section 72 includes a heater to heat the HP. Further, one end of the gas supply pipe 73A is connected to the vaporizing section 72, and the other end of the gas supply pipe 73A is connected to the $N_2$ gas supply source 75 through a valve V5 and a gas heater 74 in this order. In this configuration, heated $N_2$ gas is supplied to the vaporizing section 72 to vaporize the HP in the vaporizing section 72, and a mixed gas 2 of $N_2$ gas and the HP gas used in the vaporizing section 72 can be introduced to the gas nozzle 41 as the second component (component E2).

A gas supply pipe 73B is also formed on the downstream side of the gas heater 74 of the gas supply pipe 73A. The gas supply pipe 73B diverges upstream from the valve V5, and the downstream end of gas supply pipe 73B is connected via a valve V6 to the downstream side of the valve V4 of the gas introduction pipe 54 and the upstream side of the flow rate adjustment section 71. With such a configuration, when the above-described component E2 (the second component) is not supplied to the gas nozzle 41, $N_2$ gas heated by the gas heater 74 is introduced to the gas nozzle 41 without passing the vaporizing portion 72. In FIG. 6, the second component supply mechanism 5B includes the flow rate adjustment section 71, the vaporizing section 72, the gas heater 74, the $N_2$ gas supply source 75, the valves V4 to V6, the gas supply pipes 73A and 73B, and the downstream portion of the flow rate adjustment section 71 in the gas introduction pipe 54.

The gas supply pipe 52 and the gas introduction pipes 53, 54 are disposed around each of the pipes, for example, a pipe heater 60 for heating the inside of the lines to prevent the EDOT derivatives and HP in each of the components in circulation from liquefying. The pipe heater 60 regulates the temperature of the components discharged from the gas nozzle 41. In the present embodiment, for convenience of illustration, the pipe heater 60 is illustrated only at a part of the pipe, but the pipe heater 60 is provided throughout the pipe in order to prevent liquefaction. Further, when the gas supplied from the gas nozzle 41 to the processing chamber 11 is simply referred to as $N_2$ gas, the gas indicates $N_2$ gas supplied alone without passing the vaporizing sections 62 and 72 as described above, and is distinguished from $N_2$ gas contained in the component.

The gas introduction pipes 53 and 54 are not limited to the configuration into which the gas supply pipe 52 connected to the gas nozzle 41 branches. The gas introduction pipes 53 and 54 may be configured as dedicated gas nozzles that independently supply the first component (the component E1) and the second component (the component E2) into the processing chamber 11. In this manner, it is possible to more effectively prevent the second component (the component E2) from acting on or reacting with the first component (the component E1) and forming the film in the flow passage before being supplied into the processing chamber 11.

The substrate processing apparatus 1 includes a controller 10 that is a computer. The controller 10 includes a program, a memory, and a CPU. The program incorporates instructions (respective steps) to proceed with processing for a wafer W, which will be described later. The program is stored in a computer storage medium, for example, a compact disc, a hard disk, a magnetic optical disk, a DVD and the like, and can be installed in the controller 10.

The controller 10 outputs a control signal to each section of the substrate processing apparatus 1 according to the program, and controls the operation of each section. Specifically, the controller 10 controls the first component supply mechanism 5A such that the first component supply mechanism 5A supplies the monomer and then the second component supply mechanism 5B such that the second component supply mechanism 5B supplies the initiator into the processing chamber 11.

The controller 10 performs control other than the above-described control. Specifically, the controller 10 controls the exhaust flow rate by the exhaust mechanism 32, the flow rate of each gas supplied to the processing chamber 11 by the flow rate adjustment sections 61 and 71, the supply of $N_2$ gas from the $N_2$ gas supply sources 65 and 75, the supply of power to each of the heaters, and the lift of the lift pins 23 by the lifting mechanism 24 by outputting control signals to each section.

Figure 7:
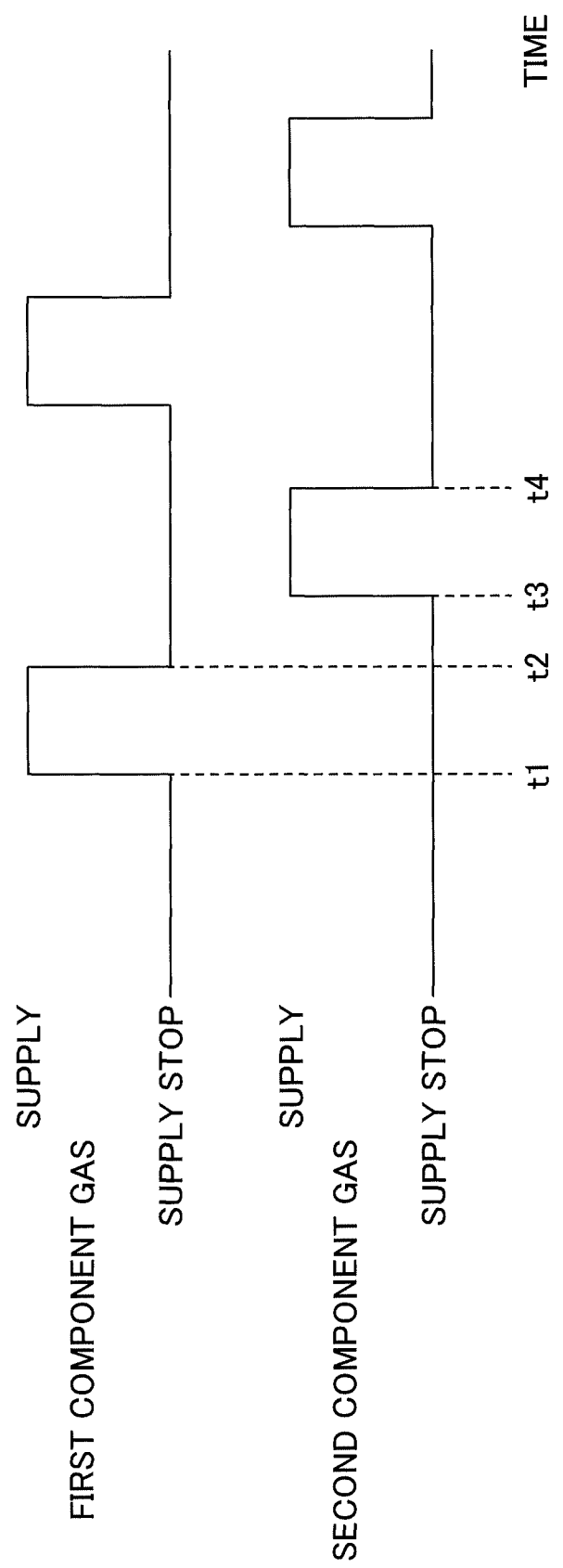
FIG. 7 is a chart illustrating a timing of supplying each component in a substrate processing system according to the present disclosure.

Next, the processing performed on the wafer W using the substrate processing apparatus 1 will be described with reference to FIG. 7. FIG. 7 is a chart illustrating a timing of supply of each component in a substrate processing system according to the present disclosure. Here, FIG. 7 illustrates only the supply of the first component (component E1) and the supply of the second component (component E2), while the supply of $N_2$ gas alone (purge gas) is omitted.

In the substrate processing apparatus 1, a wafer W is carried into the processing chamber 11 by a transfer mechanism (not illustrated) and is transferred onto the stage 21 via lift pins 23. The sidewall heater 12, ceiling heater 13, stage heater 20, and pipe heater 60 are each heated to predetermined temperatures. The inside of the processing chamber 11 is adjusted to be a vacuum atmosphere of a predetermined pressure.

The first component supply mechanism 5A supplies the first component (component E1) gas containing the EDOT derivative to the gas nozzle 41, and the second component supply mechanism 5B supplies $N_2$ gas to the gas nozzle 41. The gases are mixed with each other and discharged from the gas nozzle 41 into the processing chamber 11 at 150 degrees C. (see FIG. 7, time t1). The mixed gas (hereinafter referred to as a mixed gas 1) contains the first component (component. E1) gas and $N_2$ gas, but does not contain the second component (component E2).

The mixed gas 1 is cooled to 100 degree C. in the processing chamber 11, circulated across the processing vessel 11, and is supplied to the wafer W. The mixed gas 1 is further cooled on the wafer W to 80 degrees C., and the first component in the mixed gas 1 is supplied to the wafer W.

The respective heaters (the sidewall heater 12, the ceiling heater 13, and the stage heater 20) disposed in the substrate processing apparatus 1 can serve as a heater that performs a baking treatment by heating the wafer W after the first component (the component E1) gas containing the EDOT derivative is supplied from the first component supply mechanism 5A. This can remove an unnecessary substance such as impurities including dust and dirt deposited or adsorbed on the wafer W, or a monomer (monomer that cannot be chemically bonded to the region of the wafer W) supplied to the region of the wafer W comprised of a material having a dielectric constant equal to or lower than that of silicon oxide (i.e., silicon oxide and the like).

A part of the first component (the component E1) adsorbed on the wafer W is covalently bonded to the termination group T on the region W1 and is chemically bonded to the region W1 of the wafer W. In addition, another part of the first component (the component E1) is bonded to the region W1 of the wafer W by covalent bonding without the termination group T. Moreover, still another part of the first component (component E1) is adsorbed on the region W2 of the wafer W (see FIG. 4B).

Subsequently, the first component supply mechanism 5A supplies $N_2$ gas instead of the first component (the component E1), and only $N_2$ gas is discharged from the gas nozzle 41 (time t2). The $N_2$ gas serves as a purge gas, and purges the first component that is not chemically bonded to the wafer W in the processing chamber 11.

Thereafter, from the second component supply mechanism 5B, a second component containing HP (component E2) is supplied to the gas nozzle 41 and is discharged from the gas nozzle 41 in a state where these gases are mixed to each other and reach 150 degrees C. (time t3). The mixed gas (hereinafter referred to as a mixed gas 2) contains the second component (component E2) gas and N2 gas, but does not contain the first component (component E1).

The mixed gas 2 is also cooled in the processing chamber 11, circulated across the processing chamber 11, supplied to the wafer W, and further cooled on the wafer W surface, similar to the mixed gas 1 containing the first component and supplied into the processing chamber 11 at a period from time t1 to time t2. Then, the second component contained in the mixed gas 2 is adsorbed on the wafer W.

The adsorbed second component (component E2) polymerizes the first component (component E1) already chemically bonded to the region W1 of the wafer W, and a film of a polymer is formed on the surface of the region W1 of the wafer W.

Subsequently, the second component supply mechanism 5B supplies $N_2$ gas instead of the second component, and the gas nozzle 41 discharges only $N_2$ gas (time t4). The $N_2$ gas serves as a purge gas, and purges a second component (component E2) that does not contribute to polymerization of the first component (component E1) in the processing chamber 11.

In the meantime, in the substrate processing system according to the present disclosure, after the component E1 containing a monomer M (EDOT derivative) is supplied, the wafer W is baked before the component E2 containing a polymerization initiator R (HP) is supplied. This baking process removes the monomer M (a monomer that cannot be chemically bonded to the substrate) adsorbed on the region W2 of the wafer W (see FIGS. 4B to 4C).

The heating temperature of the baking process is not particularly limited, but may be from 30 degrees C. to 200 degrees C., from 50 degrees C. to 180 degrees C., and from 60 degrees C. to 170 degrees C. The heating time of the baking process is not particularly limited, but may be 5 seconds or more and 3 minutes or less, and may be 10 seconds or more and 60 seconds or less. Such a baking process is performed in humidity controlled conditions.

In the above-described series of processes, the gas nozzle 41 discharges the mixed gas 1 containing the first component (the component E1); the gas nozzle 41 discharges only $N_2$ gas; and the gas nozzle 41 discharges the mixed gas 2 containing the second component. If this sequence of processes is defined as one cycle, the cycle is repeated after time t4, while increasing the film thickness of the polymer. When a predetermined number of cycles is performed, the discharge of gas from the gas nozzle 41 is stopped.

In the substrate processing system according to the present disclosure, when the first component (the component E1) is supplied to the wafer W, the monomer M (the EDOT derivative) in the component E1 is bonded to the surface of the region W1 but is not bonded to the surface of the region W2. That is, in the present embodiment, the monomer M (EDOT derivative) can be selectively chemically bonded to the region W1 of the wafer W (see FIGS. 4B and 4C).

Then, when the component E2 is supplied to the wafer W, the monomer M (EDOT derivative) in the component E1 is polymerized on the region W1 of the wafer W. Thus, a polymer film is formed on the region W1 of the wafer W and is not formed on the region W2 of the wafer W. That is, according to the substrate processing system of the present disclosure, the polymer can be selectively deposited on the region W1 of the wafer W (see Step S3, FIG. 4D).

Further, in the substrate processing system according to the present disclosure, the second component (the component E2) is supplied after supplying the first component (the component E1) (see Step S2, Step S3, and FIG. 7). Thus, the polymerization initiator R (HP) in component E2 can initiate polymerization of the monomer by simply bringing (or in the vapor phase) the monomer M (EDOT derivative) into contact with a substrate (region W1 of wafer W) to which the monomer M (EDOT derivative) is chemically bonded as a gas (see FIGS. 4B to 4D).

Thus, because an agent having a low boiling point such as hydrogen peroxide (HP) can be used as the polymerization initiator R in the component E2, it is not necessary to use a metal compound such as molybdenum chloride (MC) as the polymerization initiator. Hence, according to the substrate processing system of the present disclosure, it is possible to inhibit the residue of metal in the polymer after film deposition.

In the substrate processing system according to the present disclosure, the surface of the region W1 of the wafer W (Si interface) is terminated with hydrogen, and a Si—H group is formed. When the component E1 is supplied to the surface of the region W1 terminated with hydrogen, a Si—C bond (covalent bond) can be formed between the Si—H group on the surface of the region W1 of the wafer W and the vinyl group of the monomer M (EDOT derivative) in the component E1. Accordingly, the monomer M in the component E1 is covalently bonded to the region W1 of the wafer W, and thus can be efficiently chemically bonded to the wafer W (substrate). Therefore, selective polymer deposition on the region W1 of the wafer W can be efficiently performed.

The monomer M (EDOT derivative) in the component E1 has an alkenyl group (vinyl group), and the vinyl group can be covalently bonded to the region W1 of the wafer W (a Si interface having a higher dielectric constant than that of silicon oxide). Thus, the monomer M in the component E1 can be efficiently chemically bonded to the region W1 of the wafer W via the vinyl group. Thus, selective polymer deposition on the region W1 of the wafer W can be efficiently performed.

In the substrate processing system of the present disclosure, impurities on the substrate can be removed by baking the substrate after supplying the component E1 containing the monomer M (EDOT derivative). In particular, in the present embodiment, the monomer M (EDOT derivative) adsorbed on the surface of the region W2 of the wafer W ($SiO_2$ interface) can be removed. Therefore, the monomer M (EDOT derivative) that cannot be chemically bonded to the wafer W (does not contribute to polymer formation) can be prevented from remaining on the substrate after the polymer P is deposited.

Also, hydrogen peroxide (HP) is one of the radical initiators, and the radical initiator can increase the polymerization efficiency of a monomer M having a conjugated heterocyclic compound structure. In the substrate processing method according to the present disclosure, by using such a radical initiator as the polymerization initiator R, the coating efficiency of the polymer P can be increased. Among the radical initiators, organic peroxides such as HP, inorganic peroxides that are radical initiators other than the organic initiators, and azo compounds and the like have a low boiling point and are free of metals in the compounds. Therefore, by using such a radical initiator as the polymerization initiator, it is possible to effectively inhibit the problem of metal residue after film deposition.

Figure 8:
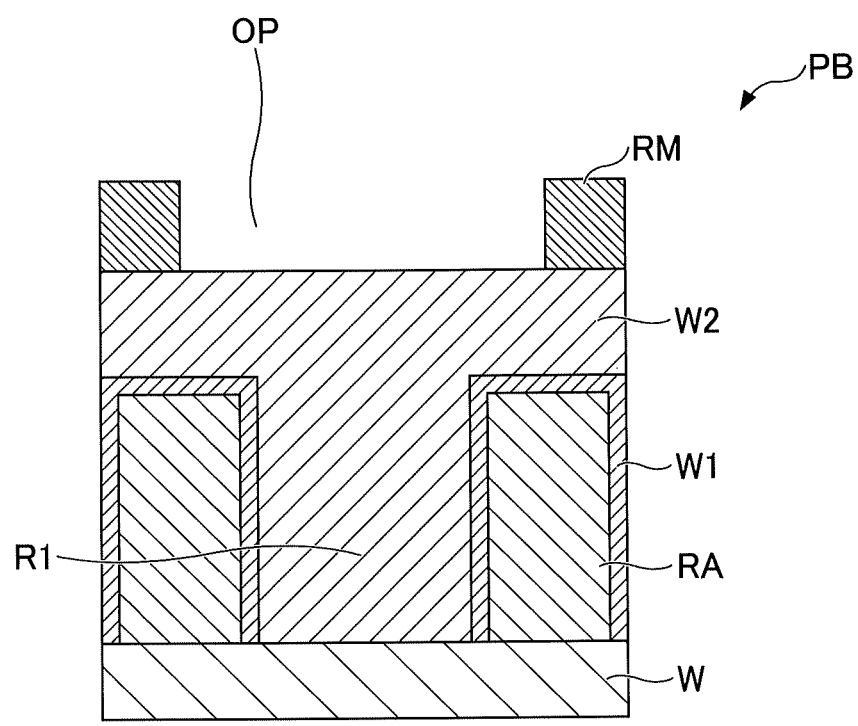
FIG. 8 is a cross-sectional view of a substrate etched by a substrate processing system according to the present disclosure.

FIGS. 8 to 14 illustrate an example of a process performed using the substrate processing system (substrate processing apparatus 1) according to the present disclosure. FIG. 8 provides a substrate (processed substrate PB) etched by the substrate processing system in accordance with the present disclosure. Specifically, as illustrated in FIG. 8, a substrate to be processed PB including a wafer W, a raised region RA, a first region W1, a second region W2, and a resist mask RM is prepared.

The wafer W is formed of silicon and forms a base portion of the substrate to be processed PB. Also, the raised region RA may be formed of silicon, and formed to be raised from the wafer W. For example, the raised region RA may comprise a gate region.

The first region W1 is formed of silicon nitride ($Si_3N_4$) and is disposed on the surface of the raised region RA and the surface of the substrate PB. The first region W1 extends to form a recess R1 as illustrated in FIG. 8. In an example illustrated in FIG. 8, the depth of the recess R1 is about 150 nm and the width of the recess R1 is about 20 nm.

The second region W2 is composed of silicon oxide ($SiO_2$), and is disposed on the wafer W and the first region W1. Specifically, the second region W2 is disposed to fill the recess R1 formed by the first region W1 and to cover the first region W1. The second region W2 may, for example, form an interlayer insulating film.

The resist mask RM is formed on the second region W2 and has an opening OP having a width that is wider than the width of the recess R1 formed by the first region W1 and the wafer W. The width of the opening OP of the resist mask RM is, for example, 60 nm. Such a pattern of the resist mask RM is formed by photolithographic techniques.

Figure 9:
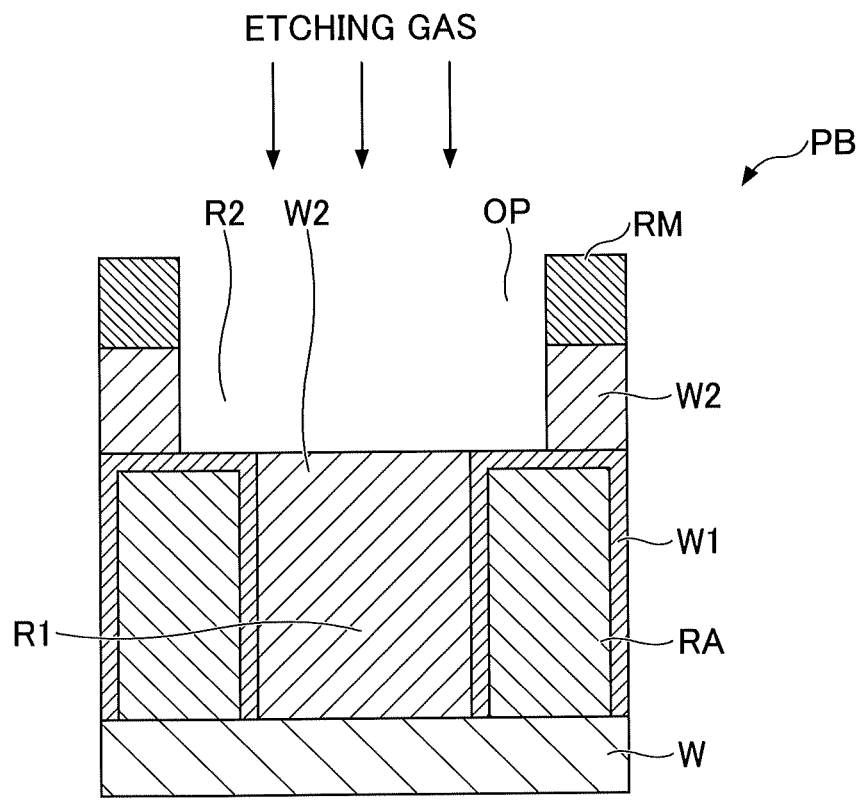
FIG. 9 is a cross-sectional view of a partially etched substrate in the substrate of FIG. 8.

In FIG. 9, the substrate to be processed PB is etched with a process gas. The process gas (etching gas) is not particularly limited, but may be an etching gas for $SiO_2$, which is commonly used, such as a fluorocarbon gas (a mixture of $O_4F_6$, Ar, and $O_2$). The etching is performed by anisotropic etching until the surface of the first region W1 is exposed. Accordingly, in the substrate to be processed PB, a recess R2 is formed by a part of the first region W1 and a part of the second region W2 (see FIG. 9).

Figure 10:
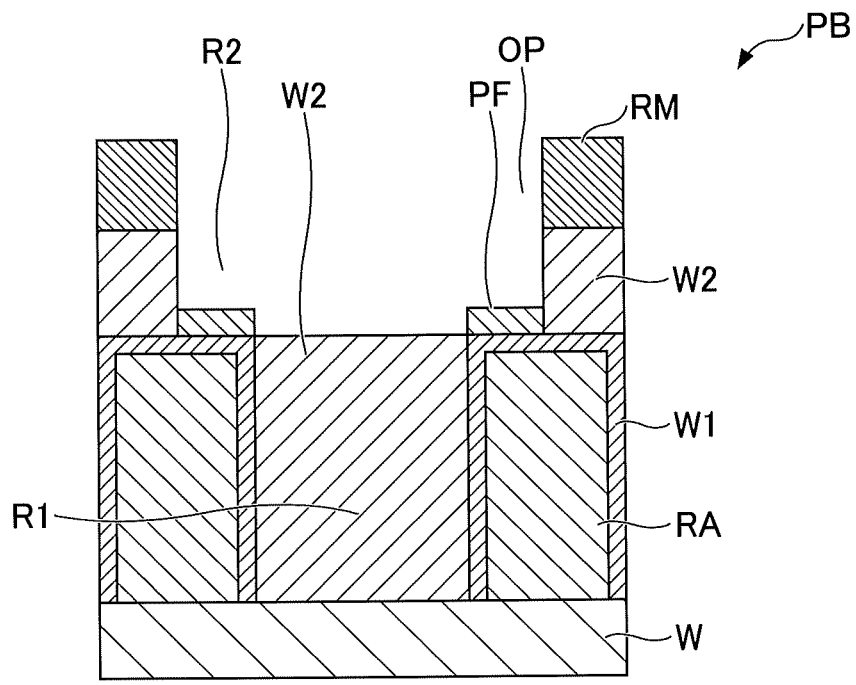
FIG. 10 is a cross-sectional view of a substrate having a protective film formed on an exposed portion of the substrate in FIG. 9.

In FIG. 10, in the substrate to be processed PB of FIG. 9, a film PF of a polymer is formed on the exposed surface of the first region W1. Specifically, the monomer M (thiophene derivative) described above is supplied to the substrate to be processed PB so that the monomer M is chemically bonded to the exposed surface of the region W1. Further, the monomer M is polymerized by supplying the above-described polymerization initiator R (radical initiator) to the substrate to be processed PB having the monomer M chemically bonded with the region W1. As a result, a film PF of a polymer P is formed (film formation) on the exposed surface of the first region W1 on the substrate to be processed PB (see FIG. 10).

Figure 11:
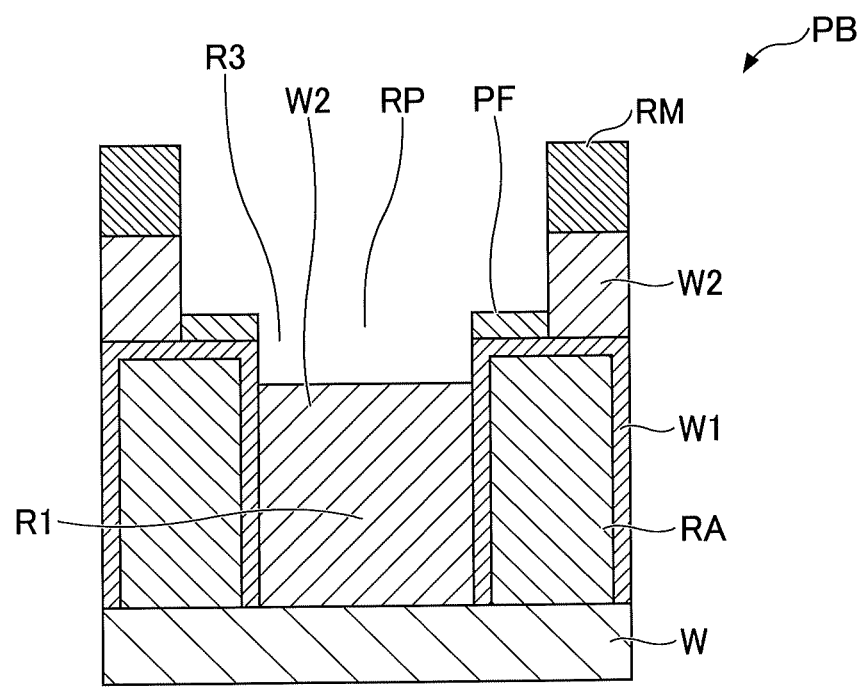
FIG. 11 is a cross-sectional view of a further partially etched substrate of FIG. 10.

In FIG. 11, the substrate to be processed PB in FIG. 10 is further etched with the above-described process gas. This exposes a portion of the side surface of the first region W1. In the substrate to be processed PB, a recess R3 is formed by a portion of the exposed side surface of the first region W1 and the surface of the second region W2. On this occasion, the second region W2 is etched in the substrate to be processed PB in a state of the exposed surface of the first region W1 protected by the polymer film PF. That is, the polymer film PF becomes a protective film for the first region W1 (see FIG. 11).

Figure 12:
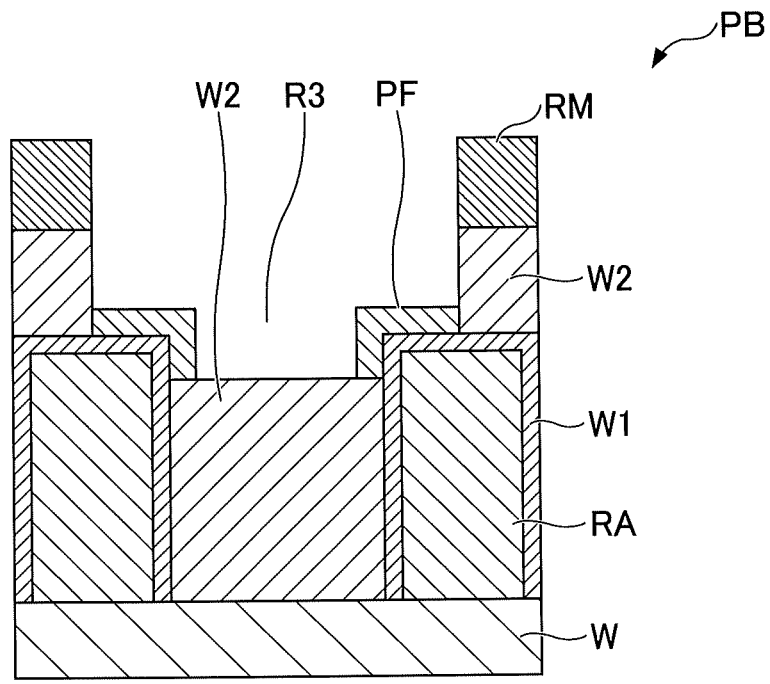

In FIG. 12, in the substrate to be processed PB of FIG. 11, a polymer film PF is formed on a portion of a side surface of the exposed first region W1. Specifically, the monomer M (thiophene derivative) described above is further supplied to the substrate to be processed PB so that the monomer M is chemically bonded to a portion of the exposed side surface of the region W1. Then, the monomer M is polymerized by further supplying the above-described polymerization initiator R (radical initiator) on the substrate to be processed PB having the monomer M chemically bonded with the portion of the exposed side of the region W1. As a result, a film PF of the polymer is formed (film formation) on the portion of the exposed side surface of the first region W1 on the substrate to be processed PB (see FIG. 12).

Figure 13:
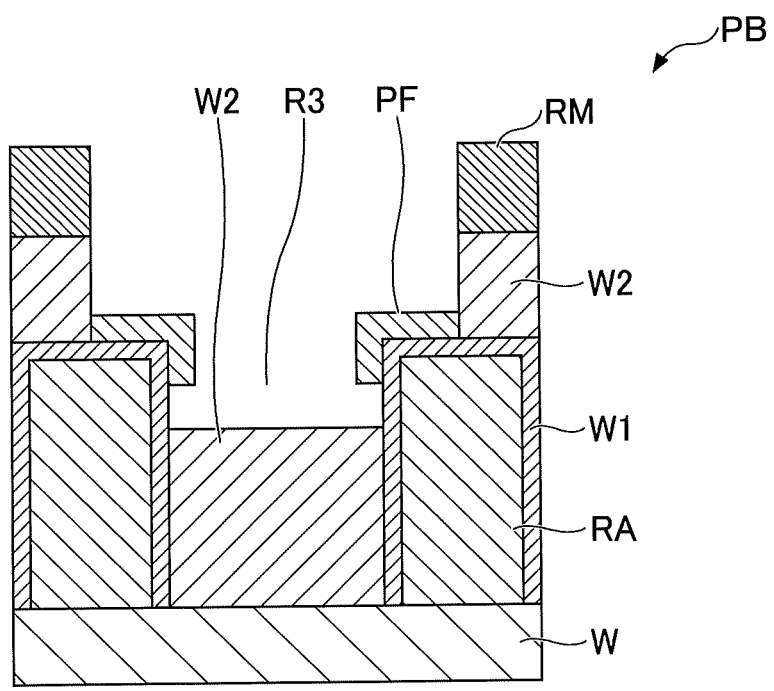
FIG. 13 is a cross-sectional view of the substrate of FIG. 12 that is further partially etched.

In FIG. 13, the substrate to be processed PB in FIG. 12 is further etched with the above-described process gas. This further exposes a portion of the side surface of the first region W1. In the substrate to be processed PB, the depth of a portion of an exposed side surface of the first region W1 and a recess R3 formed by the surface of the second region W2 becomes deeper from the state of FIG. 12 (see FIG. 13). On this occasion, the second region W2 is etched in the substrate to be processed PB while a part of the exposed surface and the side surface of the first region W1 is protected by the film PF of the polymer P. That is, the polymer film PF also becomes a protective film for a portion of the exposed side surfaces of the first region W1 (see FIG. 13).

Figure 14:
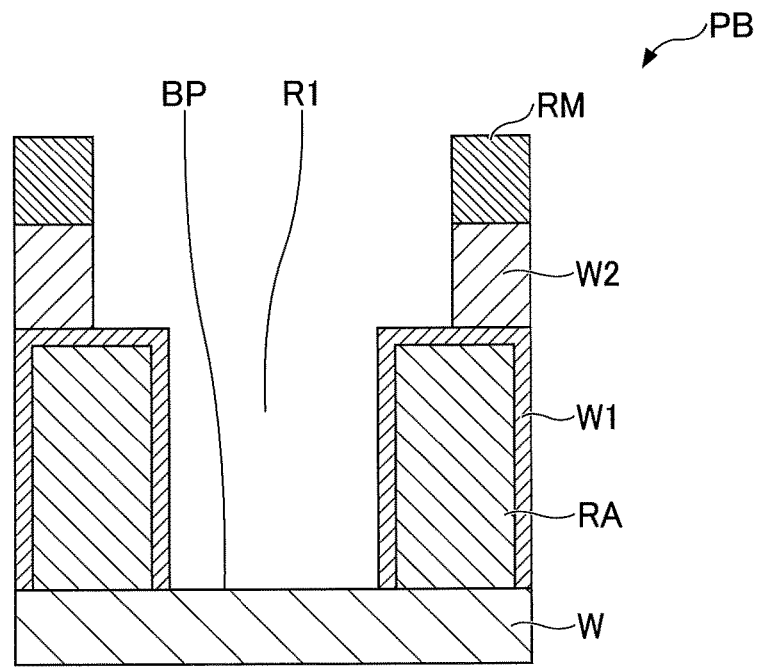
FIG. 14 is a cross-sectional view of a substrate from which a protective film is removed by a substrate processing system according to the present disclosure.

Then, as illustrated in FIG. 14, the operation of FIGS. 12 and 13 is repeated until the bottom (part of the surface of the wafer W) BP of the recess R1 of the substrate to be processed PB is exposed. Specifically, the second region W2 is etched while the film PF of the polymer P protects the exposed top surface and an exposed portion of the side surface of the first region W1. When the second region W2 filling the recess R1 is removed, the process of forming the film PF of the polymer and etching is completed. The recess R1 formed in the substrate to be processed PB may, for example, form a recess for embedding an interconnection.

The resist mask RM and the second region W2 immediately under the resist mask RM may remain in a state of FIG. 14. The remaining resist mask RM and the second region W2 can then be removed by an ashing process and the like.

The above-described film deposition process of the polymer film PF and the etching process may be performed in the same processing chamber of the substrate processing system (substrate processing apparatus 1) according to the present disclosure. In addition, the film deposition process of the polymer film PF and the etching process may be performed by providing different apparatus configurations or different apparatus mechanisms in the same apparatus.

In the substrate processing system according to the present disclosure, because the supplied monomer M includes the structure of a conjugated heterocycle compound (e.g., thiophene), and because the polymer P polymerized by polymerizing the monomer M has a long conjugate system of double bonds, the film of the polymer P acquires resistance to oxidation treatment, sputtering, and the like as the above-described protective film.

[Example]

Hereinafter, the present disclosure will be described in detail with reference to examples. Examples and Comparative Examples were measured and evaluated as follows.

[Substrate Processing]

Figure 15:
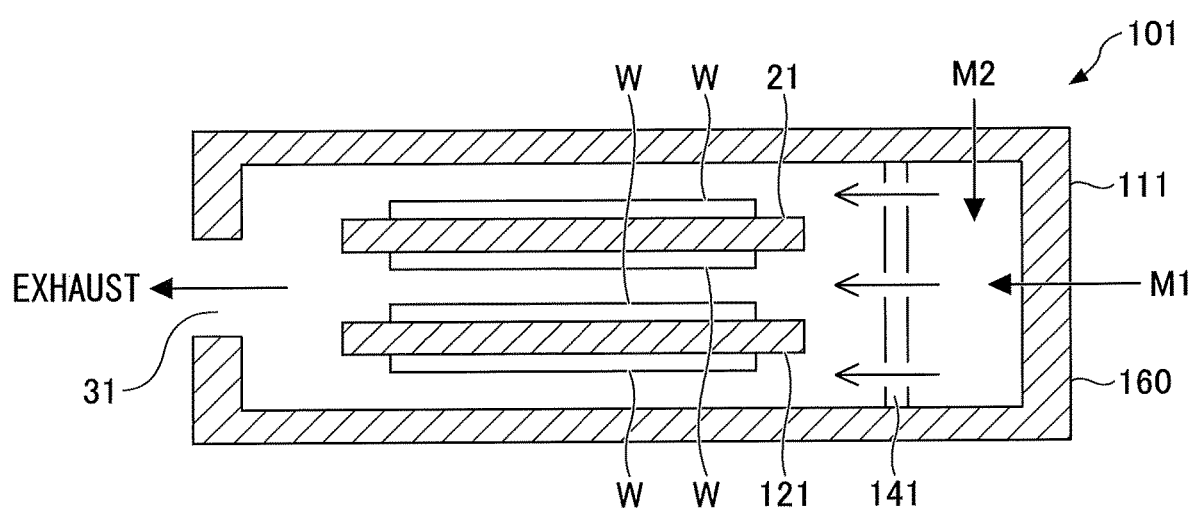
FIG. 15 is a schematic diagram of a substrate processing apparatus for measurement to evaluate a substrate processing method according to the present disclosure.

A polymer film is formed using a substrate processing apparatus 101 for measurement as illustrated in FIG. 15. Specifically, a temperature of a wafer W in a processing chamber 111 is adjusted to a predetermined temperature, and a polymer is deposited on the wafer W by alternately supplying a component E1 (a gas containing a monomer) and a component E2 (a gas containing a polymerization initiator) as illustrated in FIG. 7. The film deposition is performed simultaneously for a plurality of wafers W, as illustrated in FIG. 15. A silicon wafer having a diameter of 300 mm is used as the wafer W. On the surface of the wafer W, a region of the SiH surface (the Si surface that terminates with hydrogen), a region of the $SiO_2$ surface, and a region of the SiN surface are provided, and substrate processing is performed in each region. It should be noted that the deposition temperature is the temperature of the wafer W and the deposition pressure is the pressure inside the processing chamber 111. A carrier gas and a purge gas during film deposition all consist of nitrogen ($N_2$).

[Thickness]

The film thickness of the polymer deposited on the wafer W is measured using an optical thin film and OCD measuring device (device named "n&k Analyzer" and manufactured by n&k Technology Inc.). Measurements are performed for 49 locations in the surface of the deposited wafer W, and the average film thickness is calculated.

[Film Composition]

An element composition in the depth direction with respect to the film thickness of the deposited polymer film is detected using X-ray photoelectron spectroscopy (XPS) equipment (AXIS-Ultra, Kratos), and a minute amount of residual metal of the deposited polymer film is detected using energy dispersion X-ray analysis (EDX) equipment (X-MAX, HORIB). The Fourier Transform Infrared Spectrophotometer (FT-IR) (FTS-575C, Nanometrics Japan, Inc.) detects the broadening of the carbon bond spectrum, which is the backbone of monomers and polymers, and determines the progress of polymerization. If the spectrum is broad, the polymerization is considered to be progressing, and if the spectrum is sharp (not broad), the polymerization is not considered to be progressing.

[Surface Selectivity]

It is checked whether the polymer film is selectively deposited by a material (SiH, $SiO_2$, SiN) on the surface of the wafer W.

[Working Example 1]

The deposition temperature was adjusted to 150 degrees C.; the deposition pressure was adjusted to 0.8 Torr; a thiophene derivative (EDOT derivative) was used as a monomer contained in a first component (ingredient E1); and hydrogen peroxide (HP) was used as a polymerization initiator (oxidant) contained in a second component (ingredient E2). As illustrated in FIG. 2, the first and second components were alternately supplied to form a polymer film (film deposition) on a wafer W such that the first component was supplied first and then the second component was supplied later. Regarding Working Example 1, the film deposition rate of the deposited polymer was evaluated. The results are given in Table 1.

[Comparative Example 1]

Molybdenum (MC) chloride was used instead of hydrogen peroxide (HP) as the polymerization initiator (oxidant) contained in the second component (ingredient E2), and the second component (ingredient E2) was supplied (coated) to the surface of the wafer W first, and then the first component (ingredient E1) was supplied later. The film was deposited and evaluated in the same manner as Working Example 1. The results are given in Table 1.

TABLE 1

|  | WORKING EXAMPLE 1 | COMPARATIVE EXAMPLE 1 |
| --- | --- | --- |
| FIRST COMPONENT | EDOT DERIVATIVE (MONOMER) | MC (OXIDANT) |
| SECOND COMPONENT | HP (OXIDANT) | EDOT DERIVATIVE (MONOMER) |
| RESIDUAL METAL | ABSENT | PRESENT |
| SURFACE SELECTIVITY | PRESENT | ABSENT |

From Table 1, a metal (molybdenum) derived from the polymerization initiator (oxidant) is detected as a residual element in Comparative Example 1. This is probably because MoCl5 reacts as an oxidizing agent and then becomes MoCl4, which has a high boiling point. In contrast, in Working Example 1, any metal is not detected naturally because the substrate process does not contain a metal content.

In Comparative Example 1, a polymer is formed regardless of the material (SiH, $SiO_2$, or SiN) of the wafer W. In contrast, in Working Example 1, a film is deposited on the SiH surface and the SiN surface of the wafer W, but is not deposited on the $SiO_2$ surface.

Thus, as discussed above, according to the embodiments of the present disclosure, a substrate processing method can be provided that can achieve at least one of selective film deposition on a substrate and a decrease of a residual metal after film deposition.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A substrate processing method, comprising:
    (a) providing a substrate having a first region containing silicon nitride and a second region containing silicon oxide;
    (b) supplying a monomer that is selectively and chemically bonded to the first region of the substrates;

(c) supplying an initiator for polymerizing the monomer to the substrate having the supplied monomer thereon, thereby forming a polymer film; and (d) etching the second region while protecting the first region by the polymer film.

2. The substrate processing method as claimed in claim 1, further comprising:

terminating the first region with hydrogen before (b).

3. The substrate processing method as claimed in claim 1, further comprising:

removing a residue on the substrate before (b).

4. The substrate processing method as claimed in claim 1, further comprising:

removing impurities on the substrate between (b) and (c).

5. The substrate processing method as claimed in claim 1, further comprising:

baking the substrate between (b) and (c).

6. The substrate processing method as claimed in claim 1, wherein the monomer contains an alkenyl group.

7. The substrate processing method as claimed in claim 6, wherein the alkenyl group is a vinyl group.

8. The substrate processing method as claimed in claim 1, wherein the initiator is a radical initiator.

9. The substrate processing method as claimed in claim 8, wherein the radical initiator is at least one selected from the group consisting of an inorganic peroxide, an organic peroxide, and an azo compound.

10. The substrate processing method as claimed in claim 1, further comprising:

repeating a cycle including (b) and (c).

11. The substrate processing method as claimed in claim 10, wherein a supply amount and a polymerizing condition of the monomer in (b) and (c) are changed with respect to each cycle.

12. The substrate processing method as claimed in claim 1, wherein the monomer has a conjugated heterocyclic compound structure.

13. The substrate processing method as claimed in claim 12, wherein the conjugated heterocyclic compound structure is a structure having an unshared electron pair.

14. The substrate processing method as claimed in claim 13, wherein a conjugated heterocyclic compound forming the conjugated heterocyclic compound structure is at least one selected from the group consisting of a thiol, an azole, and an oxole.

15. A substrate processing method, comprising:

(a) providing a substrate including:

a wafer;

a raised region formed to be raised from the wafer and forming a recess that is defined by the raised region;

a first region disposed on a surface of the raised region; and a second region disposed so as to fill the recess, said first region containing silicon nitride and the second region containing silicon oxide;

(b) etching the second region until the first region is exposed;

(c) supplying a monomer that is selectively and chemically bonded to the first region of the substrate;

(d) supplying an initiator for polymerizing the monomer to the substrate having the supplied monomer thereon, thereby forming a polymer film; and (e) etching the second region while protecting the first region by the polymer film.

16. A substrate processing method, comprising:

(a) providing a substrate having a first region containing silicon or metal and a second region that differs in composition from a composition of the first region;

(b) supplying a monomer that is chemically bonded to the first region of the substrate;

(c) supplying an initiator for polymerizing the monomer to the substrate having the supplied monomer thereon, thereby forming a polymer film; and (d) etching the second region while protecting the first region by the polymer film.

17. The substrate processing method as claimed in claim 16, wherein the first region contains silicon nitride and the second region contains at least one of silicon oxide, aluminum oxide, or titanium oxide.

* * * * *